United States Patent [19]
Greiff

[11] Patent Number: 5,725,729
[45] Date of Patent: *Mar. 10, 1998

[54] PROCESS FOR MICROMECHANICAL FABRICATION

[75] Inventor: Paul Greiff, Wayland, Mass.

[73] Assignee: The Charles Stark Draper Laboratory, Inc., Cambridge, Mass.

[*] Notice: The term of this patent shall not extend beyond the expiration date of Pat. No. 5,605,598.

[21] Appl. No.: 698,479

[22] Filed: Aug. 15, 1996

Related U.S. Application Data

[63] Continuation of Ser. No. 312,326, Sep. 26, 1994, abandoned.

[51] Int. Cl.$^6$ ............................................. H01L 21/3105
[52] U.S. Cl. ........................... 156/657.1; 156/628.1; 156/630.1; 216/2; 216/11; 437/228; 437/901
[58] Field of Search ......................... 216/2, 11; 437/228, 437/921, 901; 148/DIG. 159; 156/628, 630, 655, 657

[56] References Cited

U.S. PATENT DOCUMENTS

| Re. 32,931 | 5/1989 | Staudte | 73/505 |
|---|---|---|---|
| Re. 33,479 | 12/1990 | Juptner et al. | 73/505 |
| 3,053,095 | 9/1962 | Koril et al. | 73/504 |
| 3,251,231 | 5/1966 | Hunt et al. | 73/505 |
| 3,370,458 | 2/1968 | Dillon | 73/141 |
| 3,696,429 | 10/1972 | Tressa | 343/180 |

(List continued on next page.)

FOREIGN PATENT DOCUMENTS

| 55-121728 | 9/1980 | Japan | H03H 919/05 |
|---|---|---|---|
| 58-136125 | 8/1983 | Japan | H03H 917/13 |
| 59-037722 | 3/1984 | Japan | H03H 917/05 |
| 59-158566 | 9/1984 | Japan | H01L 29/84 |
| 61-144576 | 7/1986 | Japan | G01P 15/09 |
| 62-071256 | 8/1987 | Japan | H01L 27/06 |
| 62-221164 | 9/1987 | Japan | H01L 29/84 |
| 63-169078 | 7/1988 | Japan | H01L 29/84 |
| 2183040 | 5/1987 | United Kingdom | G01F 15/02 |
| 92/01941 | 2/1992 | WIPO | G01P 9/04 |
| 93/05401 | 3/1993 | WIPO | G01P 9/04 |

OTHER PUBLICATIONS

Barth, P.W. et al., "A Monolithic Silicon Accelerometer With Integral Air Damping and Overrange Protection," 1988 IEEE, pp. 35–38.

Boxenhorn, B., et al., "An Electrostatically Rebalanced Micromechanical Accelerometer," AIAA Guidance, Navigation and Control Conference, Boston, Aug. 14–16, 1989, pp. 118–122.

Boxenhorn, B., et al., "Micromechanical Inertial Guidance System and its Application," Fourteenth Biennial Guidance Test Symposium, vol. 1, Oct. 3–5, 1989, pp. 113–131.

Boxenhorn, B., et al., "Monolithic Silicon Accelerometer," Transducers '89, Jun. 25–30, 1989, pp. 273–277.

Boxenhorn, B., et al., "A Vibratory Micromechanical Gyroscope," AIAA Guidance, Navigation and Control Conference, Minneapolis, Aug. 15–17, 1988, pp. 1033–1040.

(List continued on next page.)

Primary Examiner—R. Bruce Breneman
Assistant Examiner—Anita Alanko
Attorney, Agent, or Firm—Weingarten, Schurgin, Gagnebin & Hayes LLP

[57] ABSTRACT

An improved process for fabricating micromechanical devices having movable members, such as gyros and accelerometers. A starting wafer includes an oxidized silicon wafer which has been wafer bonded to a second silicon wafer which has a thin N layer on a P substrate. The wafer is patterned, doped and etched in a series of process steps which include the deposition of epitaxial layers to configure critical device dimensions and geometry. Metallizations are deposited for electrical/electronic interconnections. The process includes an ability to integrate on-chip electronics on the silicon substrate. Alignment difficulties and thermal mismatch associated with prior art processes are minimized.

19 Claims, 14 Drawing Sheets

U.S. PATENT DOCUMENTS

| | | | |
|---|---|---|---|
| 3,913,035 | 10/1975 | Havens | 331/107 R |
| 4,044,305 | 8/1977 | Oberbeck | 324/154 R |
| 4,122,448 | 10/1978 | Martin | 343/7.7 |
| 4,144,764 | 3/1979 | Hartzell, Jr. | 73/497 |
| 4,155,257 | 5/1979 | Wittke | 73/497 |
| 4,234,666 | 11/1980 | Gursky | 428/573 |
| 4,321,500 | 3/1982 | Paros et al. | 310/321 |
| 4,336,718 | 6/1982 | Washburn | 73/517 B |
| 4,342,227 | 8/1982 | Petersen et al. | 73/510 |
| 4,381,672 | 5/1983 | O'Connor et al. | 73/505 |
| 4,406,992 | 9/1983 | Kurtz et al. | 338/2 |
| 4,411,741 | 10/1983 | Janata | 204/1 T |
| 4,414,852 | 11/1983 | McNeill | 73/765 |
| 4,447,753 | 5/1984 | Ochiai | 310/312 |
| 4,468,584 | 8/1984 | Nakamura et al. | 310/370 |
| 4,478,076 | 10/1984 | Bohrer | 73/204 |
| 4,478,077 | 10/1984 | Bohrer et al. | 73/204 |
| 4,483,194 | 11/1984 | Rudolf | 73/517 R |
| 4,484,382 | 11/1984 | Kawashima | 29/25.35 |
| 4,490,772 | 12/1984 | Blickstein | 361/281 |
| 4,495,499 | 1/1985 | Richardson | 343/5 DD |
| 4,499,778 | 2/1985 | Westhaver et al. | 74/5 F |
| 4,502,042 | 2/1985 | Wuhrl et al. | 340/568 |
| 4,522,072 | 6/1985 | Sulouff et al. | 73/765 |
| 4,524,619 | 6/1985 | Staudte | 73/505 |
| 4,538,461 | 9/1985 | Juptner et al. | 73/505 |
| 4,585,083 | 4/1986 | Nishiguchi | 177/229 |
| 4,590,801 | 5/1986 | Merhav | 73/510 |
| 4,592,242 | 6/1986 | Kempas | 74/5 F |
| 4,596,158 | 6/1986 | Strugach | 74/5 F |
| 4,598,585 | 7/1986 | Boxenhorn | 73/505 |
| 4,600,934 | 7/1986 | Aine et al. | 357/26 |
| 4,619,001 | 10/1986 | Kane | 455/192 |
| 4,621,925 | 11/1986 | Masuda et al. | 356/350 |
| 4,628,283 | 12/1986 | Reynolds | 331/68 |
| 4,629,957 | 12/1986 | Walters et al. | 318/662 |
| 4,639,690 | 1/1987 | Lewis | 331/96 |
| 4,644,793 | 2/1987 | Church | 73/505 |
| 4,651,564 | 3/1987 | Johnson et al. | 73/204 |
| 4,653,326 | 3/1987 | Danel et al. | 73/517 R |
| 4,654,663 | 3/1987 | Alsenz et al. | 340/870.3 |
| 4,665,605 | 5/1987 | Kempas | 29/434 |
| 4,670,092 | 6/1987 | Motamedi | 156/643 |
| 4,671,112 | 6/1987 | Kimura et al. | 73/505 |
| 4,674,180 | 6/1987 | Zavracky et al. | 29/622 |
| 4,674,319 | 6/1987 | Muller et al. | 73/23 |
| 4,674,331 | 6/1987 | Watson | 73/505 |
| 4,679,434 | 7/1987 | Stewart | 73/517 B |
| 4,680,606 | 7/1987 | Knutti et al. | 357/26 |
| 4,699,006 | 10/1987 | Boxenhorn | 73/517 AV |
| 4,705,659 | 11/1987 | Bernstein et al. | 264/29.6 |
| 4,706,374 | 11/1987 | Murkami | 437/225 |
| 4,712,439 | 12/1987 | North | 74/84 R |
| 4,727,752 | 3/1988 | Peters | 73/517 AV |
| 4,735,506 | 4/1988 | Pavlath | 356/350 |
| 4,736,629 | 4/1988 | Cole | 73/517 R |
| 4,743,789 | 5/1988 | Puskas | 310/316 |
| 4,744,248 | 5/1988 | Stewart | 73/505 |
| 4,744,249 | 5/1988 | Stewart | 73/505 |
| 4,747,312 | 5/1988 | Herzl | 73/861.38 |
| 4,750,364 | 6/1988 | Kawamura et al. | 73/510 |
| 4,761,743 | 8/1988 | Wittke | 364/484 |
| 4,764,244 | 8/1988 | Chitty et al. | 156/630 |
| 4,776,924 | 10/1988 | Delapierre | 156/647 |
| 4,783,237 | 11/1988 | Aine et al. | 437/15 |
| 4,789,803 | 12/1988 | Jacobsen et al. | 310/309 |
| 4,792,676 | 12/1988 | Hojo et al. | 250/231 GY |
| 4,805,456 | 2/1989 | Howe et al. | 73/517 AV |
| 4,808,948 | 2/1989 | Patel et al. | 331/4 |
| 4,834,538 | 5/1989 | Heeks et al. | 356/350 |
| 4,851,080 | 7/1989 | Howe et al. | 156/647 |
| 4,855,544 | 8/1989 | Glenn | 200/61.45 R |
| 4,869,107 | 9/1989 | Murakami | 73/517 R |
| 4,882,933 | 11/1989 | Petersen et al. | 73/517 R |
| 4,884,446 | 12/1989 | Ljung | 73/505 |
| 4,890,812 | 1/1990 | Chechile et al. | 248/674 |
| 4,893,509 | 1/1990 | MacIver et al. | 73/517 AV |
| 4,898,032 | 2/1990 | Voles | 73/505 |
| 4,899,587 | 2/1990 | Staudte | 73/505 |
| 4,900,971 | 2/1990 | Kawashima | 310/361 |
| 4,901,586 | 2/1990 | Blake et al. | 73/862.59 |
| 4,916,520 | 4/1990 | Kurashima | 357/71 |
| 4,922,756 | 5/1990 | Henrion | 73/517 R |
| 4,929,860 | 5/1990 | Hulsing, II et al. | 310/366 |
| 4,981,359 | 1/1991 | Tazartes et al. | 356/350 |
| 5,001,383 | 3/1991 | Kawashima | 310/367 |
| 5,016,072 | 5/1991 | Greiff | 357/26 |
| 5,025,346 | 6/1991 | Tang | 361/283 |
| 5,038,613 | 8/1991 | Takenaka et al. | 73/510 |
| 5,060,039 | 10/1991 | Weinberg et al. | 357/26 |
| 5,090,809 | 2/1992 | Ferrar | 356/350 |
| 5,094,537 | 3/1992 | Karpinski, Jr. | 356/350 |
| 5,138,883 | 8/1992 | Paquet et al. | 73/504 |
| 5,195,371 | 3/1993 | Greiff | 73/505 |
| 5,203,208 | 4/1993 | Bernstein | 73/505 |
| 5,205,171 | 4/1993 | O'Brien et al. | 73/517 B |
| 5,216,490 | 6/1993 | Greiff et al. | 73/517 R |
| 5,226,321 | 7/1993 | Varnham et al. | 73/505 |
| 5,233,874 | 8/1993 | Putty et al. | 73/517 AV |
| 5,241,861 | 9/1993 | Hulsing, II | 73/505 |
| 5,369,544 | 11/1994 | Mastrangelo | 361/283.4 |
| 5,535,902 | 7/1996 | Greiff | 437/228 |
| 5,591,678 | 1/1997 | Bendik et al. | 156/630.1 |

OTHER PUBLICATIONS

Howe, R., et al., "Silicon Micromechanics: Sensors and Actuators On a Chip," IEEE Spectrum, Jul. 1990, pp. 29–35.

Moskalik, L., "Tensometric Accelerometers with Overload Protection," Meas. Tech (USA), vol. 22, No. 12, Dec. 1979 (publ. May 1980), pp. 1469–1471.

Nakamura, M., et al., "Novel Electrochemical Micro–Machining and Its Applicatio for Semiconductor Acceleration Sensor IC," *Digest of Technical Papers* (1987) Institute of Electrical Engineers of Japan, pp. 112–115.

Petersen, K.E. et al., "Micromechanical Accelerometer Integrated with MOS Detection Circuitry," IEEE, vol. ED–29, No. 1 (Jan. 1982), pp. 23–27.

Petersen, Kurt E., et al., "Silicon as a Mechanical Material," *Proceedings of the IEEE*, vol. 70, No. 5, May 1982, pp. 420–457.

"Quartz Rate Sensor Replaces Gyros," *Defense Electronics*, Nov. 1984, p. 177.

Rosen, Jerome, "Machining In the Micro Domain," *Mechanical Engineering*, Mar., 1989, pp. 40–46.

Teknekron Sensor Development Corporation, article entitled "Micro–Vibratory Rate Sensor," 1080 Marsh Road, Menlo Park, CA 94025, 2 pages, undated.

Bryzek, Janusz et al., "Micromachines on the March," IEEE Spectrum, May 1994, pp. 20–31.

IEEE Robotics & Automation Soc. in coop. w/ASME Dynamic Systems & Control Div., "Micro Electro Mechanical Systems, An Investigation of Micro Structures, Sensors, Actuators, Machines and Systems," IEEE Cat. #93CH3265-6. Library of Congress #92-56273, Ft. Lauderdale, FL, Feb. 7–Oct. 1993.

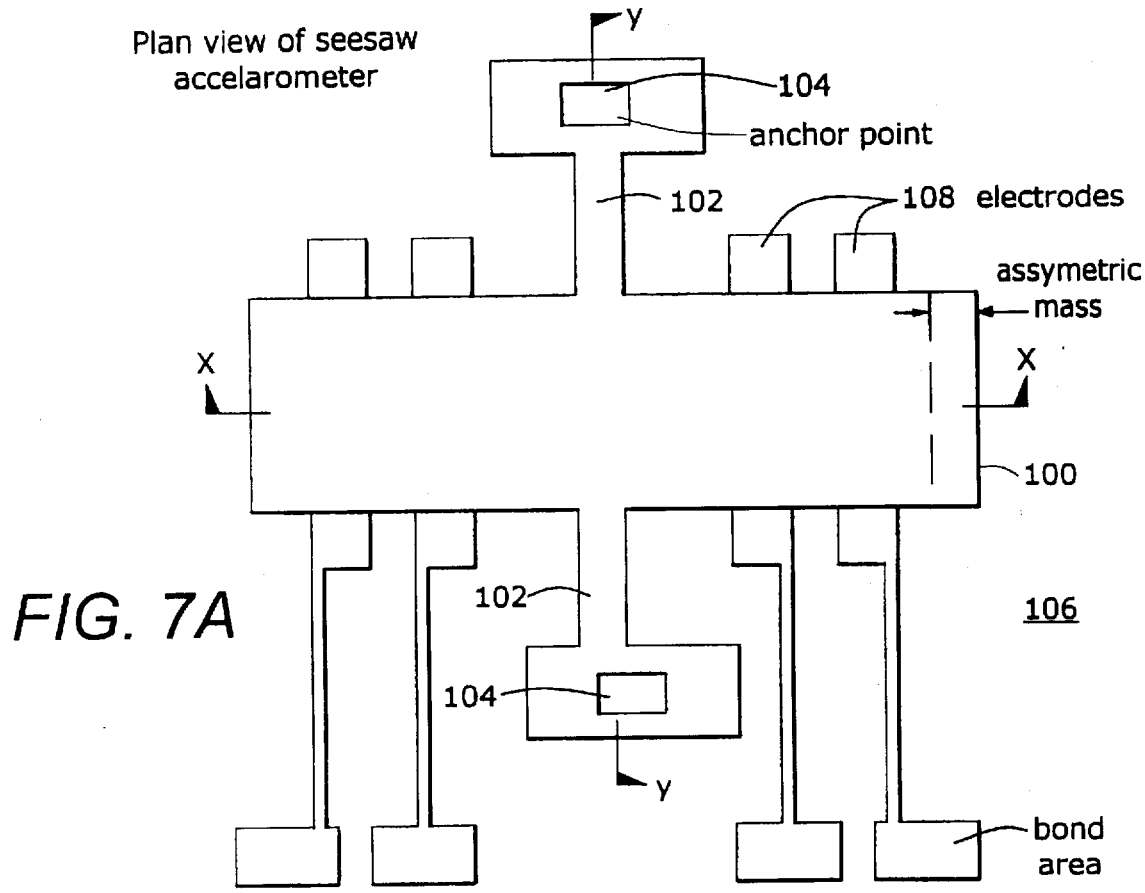
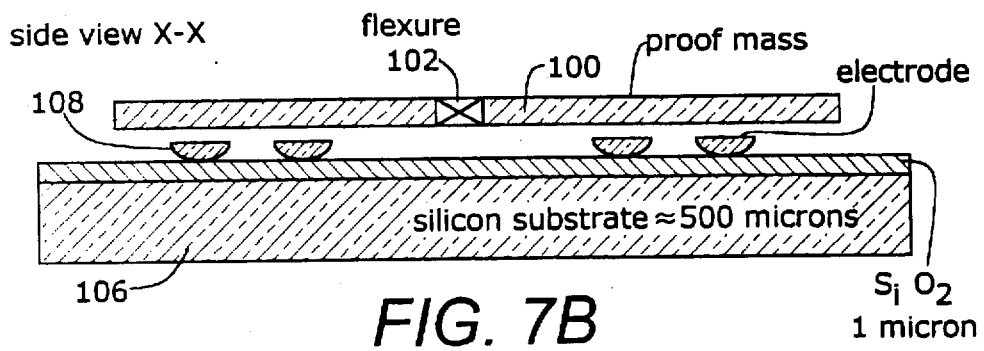
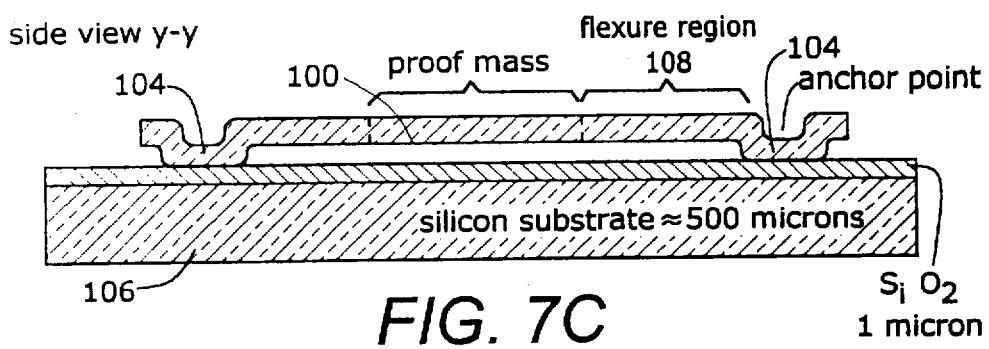

single epi process

Single Epi Electrochemical Process

Single Epi Electrochemical Process

PROCESS FOR MICROMECHANICAL FABRICATION

This application is a continuation of application Ser. No. 08/312,326 filed Sep. 26, 1994, abandoned.

FIELD OF THE INVENTION

The present invention relates to processes for fabricating micromechanical devices, and in particular to processes for fabricating micromechanical devices in semiconductive materials.

BACKGROUND OF THE INVENTION

Processes are known for fabricating various mechanical structures in semiconductive materials using semiconductor fabrication techniques. U.S. Pat. No. 5,013,396 to Wise discloses a process wherein a miniature force sensing device having a movable member is fabricated by forming a mesa on a silicon wafer to be used as a part of a support structure for the movable member. A first selected portion of the wafer, including the mesa, is impregnated with a material to alter the etching characteristic thereof. A second selected portion of the silicon wafer, which will become at least part of the movable member, is impregnated as well to alter its etching characteristics. The support structure is formed by etching, to remove portions of the silicon wafer adjacent to the first and second portions, thus forming the movable member and support structure therefor. The "double diffused" structure is electrostatically bonded to a glass support plate prior to etching of the wafer.

A critical step in this dissolved wafer process is the anodic bonding of a glass substrate, typically containing electrodes disposed thereon, and the silicon wafer or substrate in which the active silicon part of the device has been formed. Given the critical role of symmetry in micromechanical instrument performance this bonding step needs to be as accurate as possible. In this process the alignment between the silicon and glass parts is done at the same time as the anodic bonding which typically requires conditions of 370 degrees C. with 600 Volts applied to the parts. This is not an ideal environment in which to do aligning, and misalignment is apt to occur.

In micromechanical inertial instruments using capacitive sensing, and which are formed by such prior art processes, the anodic bond also determines the gap between the electrodes and the proof mass or movable member that is capacitively sensed. The gap is typically very small, about one to three microns, and only a few bits of dust can result in a wedge effect causing a variation in the gap across the wafer and hence a significant variation in device characteristics.

Furthermore, the silicon and glass substrates to be aligned and bonded are thermally mismatched to some degree. In production the manufacturer will work with 4, 6, or perhaps even 8 inch diameter silicon and glass substrates and problems due to mismatch are likely. Such mismatch results in misalignment effects which tend to get worse as larger substrates are handled.

Additional difficulties are inherent in prior art silicon on glass processes, as the glass substrates to which the silicon devices are bonded are not compatible with on-chip electronics that may be desirable. In addition, spurious charging of glass substrates has been found to occur which reduces performance or complicates electronics required to minimize charging. Charging does not occur with a silicon substrate.

SUMMARY OF THE INVENTION

The present invention provides an improved process for fabricating micromechanical devices having movable members, such as gyros and accelerometers. A starting wafer includes an oxidized silicon wafer which has been wafer bonded to a second silicon wafer which has a thin N layer on a P substrate. The wafer is patterned, doped and etched in a series of process steps which include the deposition of epitaxial layers to configure critical device dimensions and geometry. Metallizations are deposited for electrical/electronic interconnections.

In an alternative embodiment, a nitride coated silicon starting wafer may be used. P+ and N type polysilicon are substituted for grown single crystal epitaxial layers. The process according to the invention uses a silicon substrate instead of a glass substrate. Although wafer bonding is used it is done without critical alignment and at a relatively early and non-critical point in the process.

In one embodiment, a see-saw accelerometer is fabricated according to the invention.

Features of the invention include, an ability to integrate on-chip electronics on the silicon substrate. Alignment difficulties associated with prior art processes are minimized. The process is designed for production and thus has great commercial application.

DESCRIPTION OF THE DRAWING

The invention will be more fully understood from the following detailed description taken in conjunction with the accompanying drawing in which:

FIG. 7A is a plan view of a see-saw accelerometer formed using the process according to the invention;

FIG. 7B is a sectioned view of the see-saw accelerometer taken along line x—x of FIG. 7A;

FIG. 7C is a sectioned view of the see-saw accelerometer taken along line y—y of FIG. 7A;

DETAILED DESCRIPTION

Figure 1A:
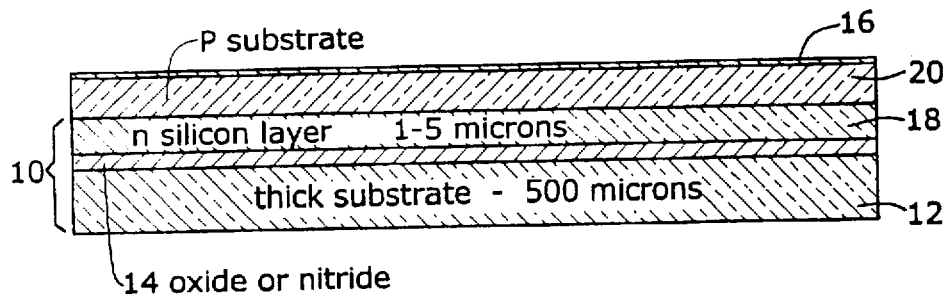
FIG. 1A is a side view in section of a starting wafer.

Referring now to FIG. 1A, the process according to the invention starts with layered wafers comprised of a first silicon wafer 12 including a dielectric portion in the form of an oxidized surface 14. Alternatively, it may be preferable to use a silicon nitride layer for a dielectric in place of the oxide layer 14 on the first silicon wafer. Preferably such a nitride layer would be silicon rich, which gives a better expansion match to the silicon than oxide. The first silicon wafer 12 is wafer bonded to a second silicon wafer 16 that is comprised of an N layer 18 on a P substrate 20. The P substrate 20 is removed by electrochemical etching or other suitable means to form a starting wafer 10.

This starting wafer will be generic to many different types of micromechanical devices as described hereinafter. Given that the individual production steps for forming such starting wafers are known to industry, it is envisioned that these starting wafers can be procured from a silicon foundry and then customized to build inertial instruments and related micromechanical structures as are described hereinafter with respect to the process according to the invention.

Figure 1B:
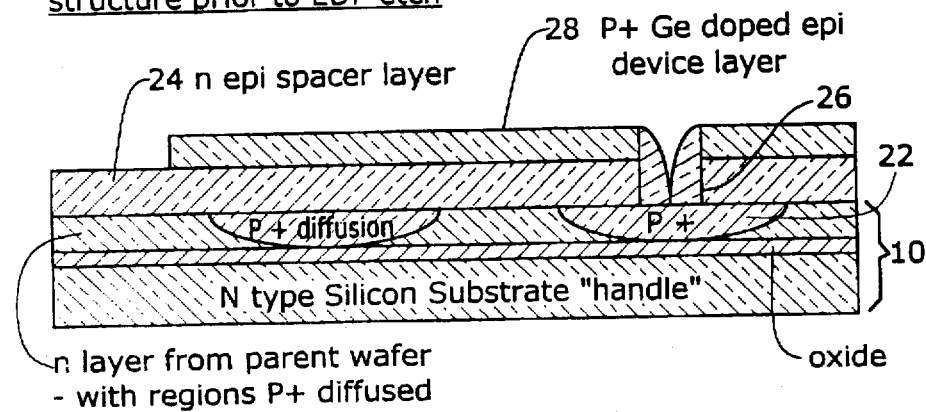
FIG. 1B is a side view in section of a processed wafer with P+ diffusions prior to an EDP etch.

The selected starting wafer 10 is oxidized and patterned by photolithography. Boron is diffused completely through the layer in the areas where electrodes or structural anchor regions are desired forming P+diffusions 22, as illustrated in FIG. 1B.

Subsequently, an N type epitaxial layer 24 is deposited to a thickness equal to a desired electrode gap. Portions of the N epitaxial layer are removed by etching to form vias 26 where it is desired to anchor the device layer to the substrate. In the micromechanical structures of this illustrative embodiment, the vias 26 are over a P+diffused region 22 which can serve as an etch stop during etching as described hereinafter.

A heavily boron doped epitaxial layer 28 is deposited to a thickness desired for the proof mass of the illustrative inertial instrument, effecting a device layer. Preferably this device layer is also doped with Germanium to match the Boron content and produce a strain free layer. The device layer being made from epitaxially deposited Boron and Germanium doped silicon means that in addition to being EDP resistant to preserve the device layer during etching, the layer is free from concentration gradients. Such gradients disadvantageously cause curling of the fabricated device. The doping of Germanium to match the Boron content keeps the ultimate device substantially free from Boron induced stress, which can also cause geometric distortion and undesirable thermal effects. Micromechanical inertial instruments tend to be optimized by having large areas with small very uniform gaps. This type of device layer is ideal for this purpose.

The P+ epitaxial layer 28 deposited, is patterned by reactive ion etching in the shape of the desired geometry. Suitable masking for this reactive ion etching step, and for the etching of the N type epitaxial layer forming the electrode gap described hereinbefore, can be effected by techniques known in the art. This may imply just using photoresist. Alternatively, a layer of metal, such as chromium, may be deposited and patterned to serve as an etch mask for the silicon etch. The P+etch may cut into the N layer but not through it as this might damage the underlying P+diffused electrode regions.

It should be appreciated by those of ordinary skill in the art that whenever epi is deposited over a step or a dielectric, some disturbance of the epi layer is obtained, this is an inherent and potentially negative aspect to the process. Such disturbance presents no problem in device layers that are removed. In each device case appropriate steps must be taken to minimize the disturbance and/or see that it occurs in a non-critical part of the device. Accordingly, these inherent disturbances can be controlled and rendered insignificant.

Metallization(s) for interconnects and bonding pads are then deposited and patterned. TiW Pd Au is a suitable metallization for such purposes. At this point the wafer is ready for etching in an EDP bath as known in the art, and has an appearance in cross section substantially as illustrated in FIG. 1B.

Figure 1C:
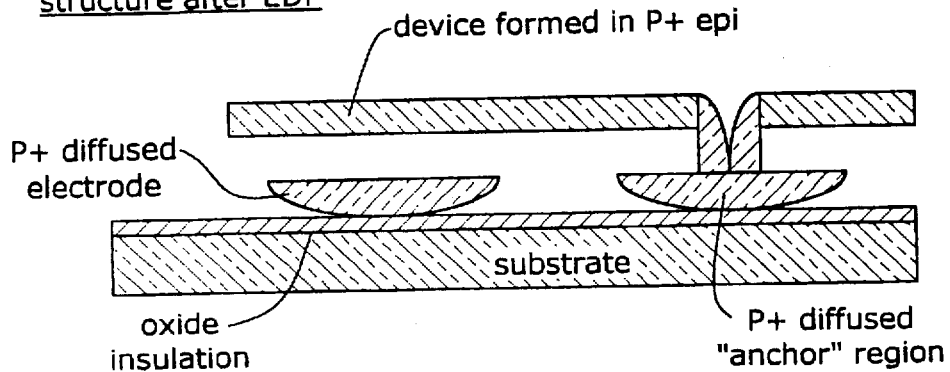
FIG. 1C is a side view in section of the completed wafer of FIG. 1B with P+ diffusions, after the EDP etch.

The wafer is then placed in an EDP bath which etches the N type material and leaves behind the heavily boron doped regions. This completes the device formation as illustrated in FIG. 1C. Typically, the electrodes are 1 to 4 microns thick, the electrode gap is 1 to 3 microns, and the device layer 5 to 20 microns in thickness.

An alternative to the above process is to use an analogous process to that described hereinbefore, but to substitute P+and N polysilicon for the single crystal epitaxially deposited layers.

Figure 2A:
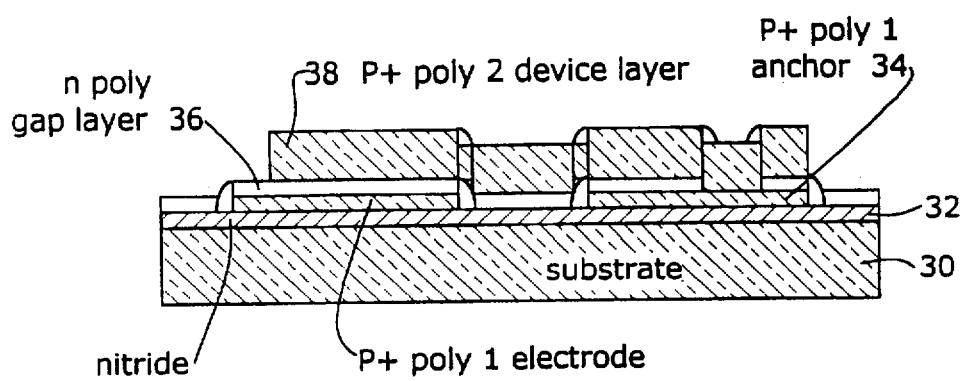
FIG. 2A is a side view in section of a polysilicon version of a micromechanical device fabricated according to the invention.

The starting wafer could then be much simpler being just a nitride coated silicon wafer. The use of polysilicon in this way is illustrated in FIGS. 2A and 2B.

The starting wafer or substrate 30 has a nitride layer 32 thereon. Electrodes and/or anchor regions are formed using P+polysilicon depositions 34. An N type polysilicon layer 36 is deposited thereover to form the desired electrode gap between the movable member/device and the electrode(s). Deposition of a second P+polysilicon layer 38 effects a device layer that will remain subsequent to EDP etching.

Figure 2B:
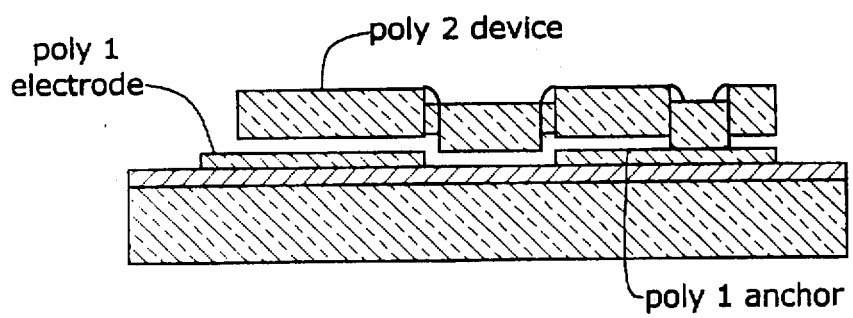
FIG. 2B is a side view in section of a polysilicon version of a micromechanical device fabricated according to the invention after an EDP etch.

The substrate with polysilicon layers is then subjected to an EDP bath to etch away the N type gap layer, yielding a structure substantially as illustrated in FIG. 2B. A potential disadvantage of this alternative embodiment is that the second polysilicon device layer may get bumpy going over the previously manipulated surfaces. However, where planarity is not a consideration this alternative may be desirable as it is a very simple process.

An identical starting wafer used and discussed with respect to FIG. 1 may also be used to start the polysilicon alternative process. This gives a less bumpy surface and can be envisioned by just changing the designations in FIG. 1 from epi to poly. It should be appreciated by those of skill in the art, that it has not yet been determined with great certainty whether thick P+polysilicon can be annealed to the proper stress free condition. Further, the precise characteristics of EDP etching of P+polysilicon have not been determined. Some experimentation may be required to determine the feasibility of using the polysilicon alternative for a given application.

It should be further appreciated in implementing the process according to the invention, that alignment of a micromechanical device in the x and y axes, that is the alignment of the proof mass to the electrodes, is vastly improved over prior art methods because such alignment is done in a conventional wafer aligner under ideal conditions.

The wafer to wafer bonding step requires no alignment and, as discussed, a generic "starting wafer" according to the invention can be provided by a silicon foundry for customizing into many different types of instruments.

Similarly, the process according to the invention yields a more uniform electrode gap. The electrode gap across the wafer is determined by an epitaxial layer deposition. This should be extremely uniform from device to device.

Thermal compatibility of the device to the substrate is vastly improved according to the invention, over prior art silicon-on-glass techniques. Perfect thermal compatibility of the device layer to the substrate is achieved because they are both silicon.

Additionally, the process should be scaleable to any size wafer a manufacturer is using.

Because the thickness of the device layer is determined by an epitaxial deposition rather than a long high temperature boron diffusion as used in prior art processes, the thickness control and repeatability should be excellent and better than the previous diffused method, especially for thick proof masses greater than 3 microns.

The process according to the invention is compatible with the implementation of on-chip circuitry. Extensive on-chip circuitry can be supplied on starting wafers produced by the foundry. There are no long high temperature steps in the subsequent micromechanical device process which would tend to disrupt the junctions already formed by the foundry. The on-chip electronics is thereby supplied and tested before the mechanical device is added. This greatly enhances the manufacturability of the instrument. It also provides a logical place to second source the "starting wafers" with appropriate components.

Furthermore, it should be appreciated that the process can be used to make structures other than those illustrated hereinbefore. FIGS. 3, 4, 5A and 5B illustrate examples of how the process according to the invention can be applied to fabricate devices other than those described hereinbefore. The descriptions are not intended to be a total process description but rather to highlight the critical steps which are required. It should be understood, with respect to the alternative structures described hereinafter, that the polysilicon alternative process may be used instead of the single crystal process for most devices.

Figure 3:
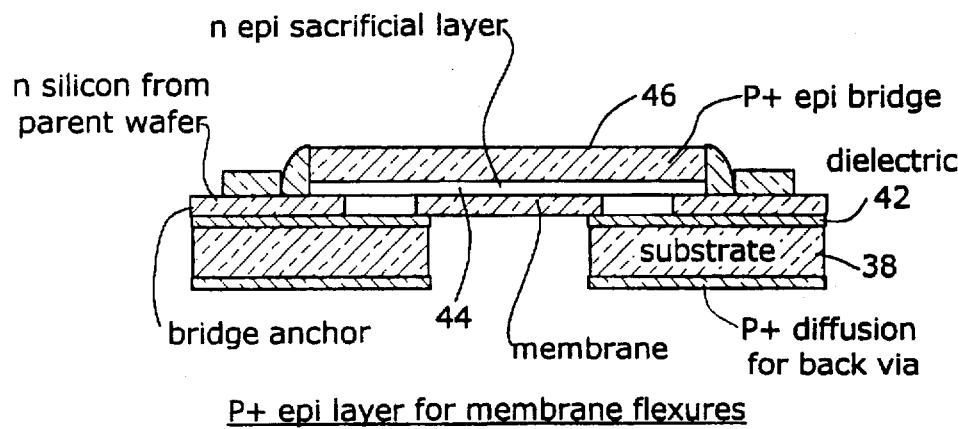
FIG. 3 is a side view in section of a membrane and single bridge micromechanical structure fabricated according to the invention.

The process according to the invention can be implemented to form a membrane plus a single bridge structure as illustrated in FIG. 3. This application of the process will be useful for making acoustic sensors such as hydrophones or microphones and other types of sensors requiring bridge electrodes as known in the art.

FIG. 3 shows a membrane and bridge process starting with the basic starting wafer 10 of FIG. 1A. The n silicon layer on top of the dielectric is of the thickness desired for the membrane. High concentration boron is diffused through the n layer where membrane or bridge anchor regions are to be formed. Multiple diffusions, not shown, may be used if the membrane is to have weak support springs of a thinner dimension than the membrane. At the same time the back of the wafer is patterned and diffused for an etch stop for the back via. Next a sacrificial n layer is deposited to the thickness desired for the membrane to bridge gap. Vias are cut in the epi layer over the bridge anchor regions. Next, a P+epi layer is deposited and patterned in the desired bridge shape. Then, metal, for example TiW/Pd/Au, is deposited and patterned where electrical connections or bond pads are desired.

Subsequent etching in EDP removes the n doped regions leaving the membrane, the bridge, and a via cut to the membrane from the back of the wafer. If desired, the dielectric on the back of the wafer may now be removed by selective etching. The exact shapes will depend on the actual sensor type and design.

The advantage of using the process according to the invention to form these types of membrane/bridge devices is that a strain-free bridge electrode is obtained. The strain-free bridge electrode is uniformly doped and formed of single crystal silicon.

Bridges are presently formed according to the prior art by use of gold or nickel electroplating. Buckling is a frequent problem with these prior art bridges. For those devices which require large area bridges and closely spaced electrodes of uniform gap the single crystal bridge processed according to the invention is a significant improvement.

Hollow suspended beam structures can be formed using the process according to the invention. Certain structures such as a vibrating wheel on a gimbal gyro may benefit from a high aspect ratio low mass structure. A process for forming hollow masses and beams according to the invention is illustrated by the cross section of a beam illustrated in FIG. 4.

Figure 4:
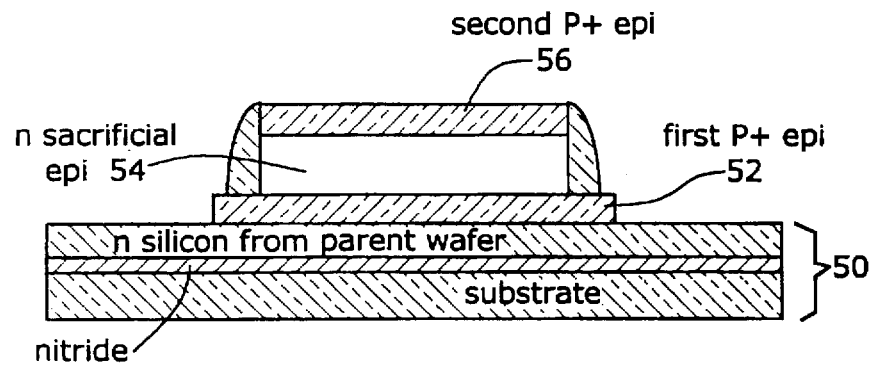
FIG. 4 is a side view in section of a hollow suspended beam micromechanical structure fabricated according to the invention.

The process starts with a starting wafer 50, as described hereinbefore. A first P+epitaxial layer 52 is deposited and patterned to form a bottom of the beam. An N sacrificial layer 54 is then deposited, patterned and etched. A second P+epitaxial layer 56 is deposited and patterned to form the top of the beam. The function of the second P+epi may be achieved by boron diffusion. Not shown in FIG. 4, is a small weep hole required to allow the EDP etchant to attack and dissolve the N layer 54 thereby forming a hollow beam suspended over the wafer surface.

Figure 5A:
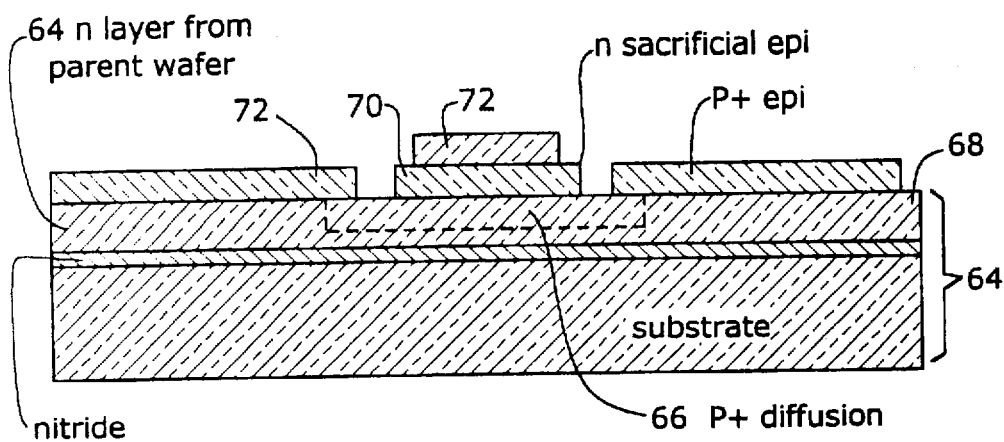
FIG. 5A is a side view in section of a mechanical cross-over micromechanical structure fabricated according to the invention prior to EDP etching.
Figure 5B:
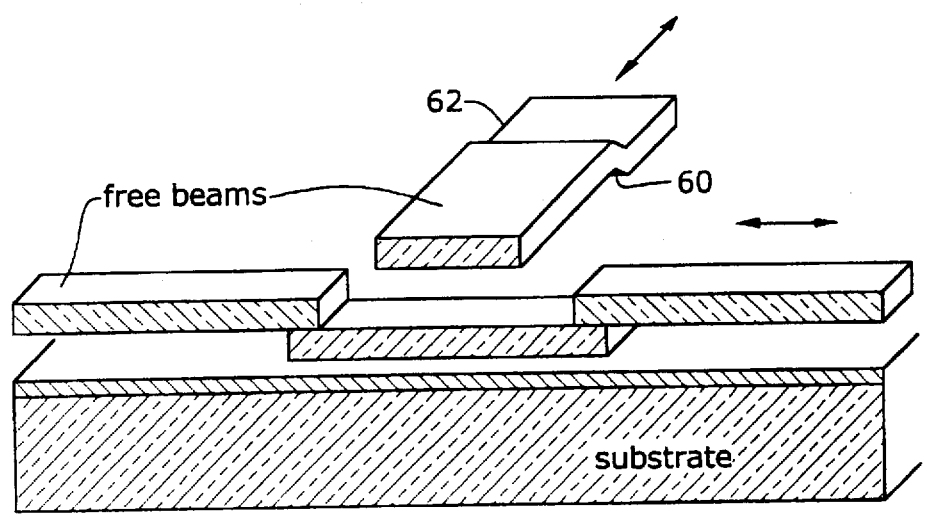
FIG. 5B is a perspective view partially in section of the mechanical cross-over micromechanical structure of FIG. 5A.

Various mechanical cross-overs can be fabricated using the process according to the invention. FIGS. 5A and 5B illustrate how a bend 60 may be put in a mechanical beam 62 to allow simultaneous formation of beams from a single epitaxial layer. These beams are capable of right angle motion with respect to each other.

The process starts with a starting wafer 64, as described hereinbefore and as illustrated in FIG. 5A. In all illustrations, the thickness of the N layer on top of the dielectric is treated as a variable which is different for different applications. The thickness of the N layer is an easily controlled parameter in the starting wafer process. A P+diffusion 66 partially through the N parent layer 68 is used to form the bottom of the bend. A sacrificial N layer 70 is deposited and patterned and etched to form a spacer pad. A P+epi beam 72 layer is deposited and patterned such that the diffused bend links one beam while the spacer layer allows the second beam to cross over the first beam. Both beams are formed from the same layer.

FIG. 5B most clearly illustrates the structure after EDP etching. No other process is presently known which will allow forming free orthogonal beams from a single layer.

The process according to the invention can be used as well to fabricate an improved double gimbal gyroscope of a structure such as described in commonly assigned U.S. Pat. No. 5,016,072, (the '072 patent), which is incorporated herein by reference.

Two potential problems with the previous process used to fabricate the double gimbal gyro of the '072 patent, were that the plates tended to curl and the bridges tended to buckle. This greatly limited the ability to hold small gap tolerances and this limited performance.

Figure 6A:
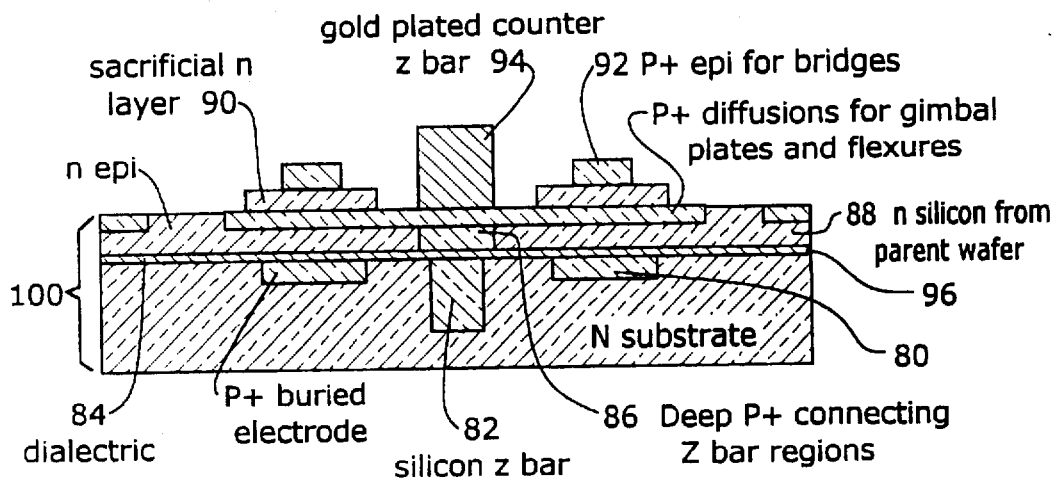
FIG. 6A is a side view in section of a double gimbal gyroscope structure formed with the process according to the invention, before etching.
Figure 6B:
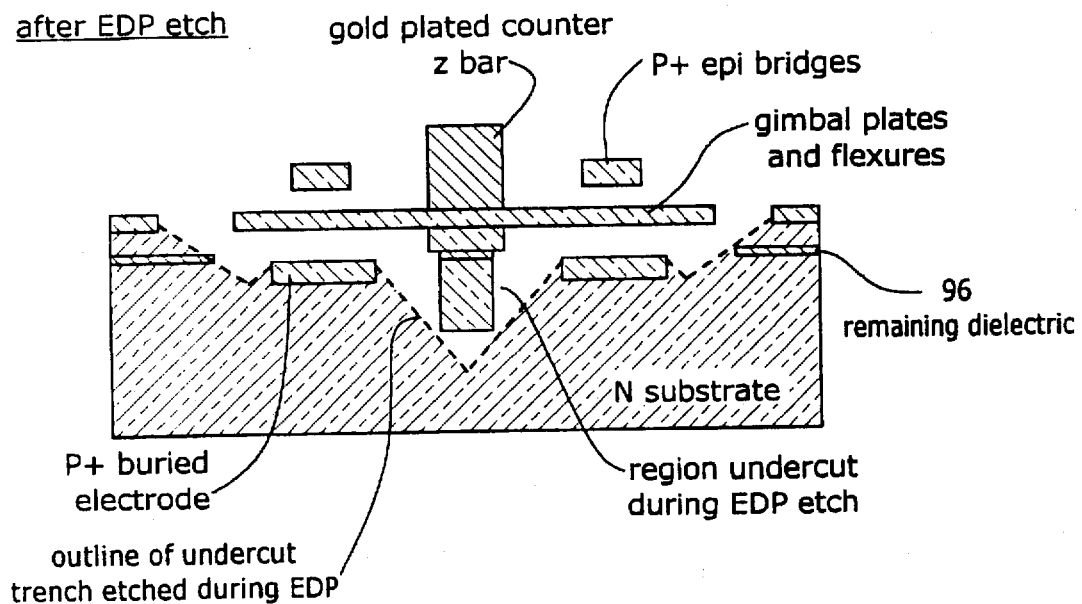
FIG. 6B is a side view in section of a double gimbal gyroscope structure formed with the process according to the invention, after etching.

Use of the process according to the invention to fabricate a double gimbal gyro such as disclosed and claimed in the '072 patent can eliminate both these problems. The plate curling can be eliminated by using a uniformly doped epi layer to form the gimbals and flexures. Bridge buckling can be eliminated by using single crystal silicon bridges which are a perfect expansion match to the gimbal layer. Implementation of the process according to the invention to fabricate a double gimbal gyro is illustrated in FIGS. 6A and 6B.

Buried electrodes 80 and silicon z bar 82 are formed as illustrated by preprocessing the silicon substrate by doping as described hereinbefore. A layer of dielectric, oxide or nitride 84 is deposited and the diffused n substrate is used to make the starting wafer 100. The process is identical to that previously described for starting wafer 10 except that the preprocessed substrate wafer is used and the silicon substrates are aligned as known in the art.

The process continues with deep diffusions where anchor regions, not shown, are needed and to form region 86 which will serve as a mechanical connection between the diffused and plated z bar regions. One or two levels of shallower P+boron diffusions are done in the surface of the n region from the parent wafer, 88. These diffusions serve to form the plate and flexures of the gyro.

An N sacrificial epitaxial layer 90 is deposited and patterned to form a spacer layer. A P+epitaxial layer 92 is deposited and patterned to form the bridge electrodes. TiW Pd Au is deposited and patterned to form electrical connections, bond pads, and a base for a counter z bar 94 plating. The counter z bar 94 is formed by photolithography and gold plating.

Finally, as illustrated in FIG. 6B, the device is undercut and 8 freed up by EDP etching. As the structure of FIG. 6A is exposed to EDP etchant it undercuts and exposes the buried dielectric 96 under the device area. The dielectric in this area is removed by further EDP etching so that undercutting of the z bar may take place as shown. The buried electrodes are EDP resistant since they are formed by a P+boron diffusion.

While it is disclosed hereinbefore that the P+epitaxial layers may be doped with Germanium to minimize the strain introduced by the high concentration of boron it will be appreciated that this is an option rather than a requirement.

Although the process as described hereinbefore is described as used to fabricate tuning fork gyros, high g accelerometers and other micromechanical structures, and to provide technical and manufacturing improvements to these devices and structures, with appropriate modification it can also be used to implement improvements in presently undisclosed micromechanical structures and processes. Furthermore, other improvements and structures may be implemented and/or combined with the present invention, such as set forth in copending, commonly assigned U.S. patent application Ser. No. 08/242,274 U.S. Pat. No. 5,605,598, which is hereby incorporated herein by reference.

A process according to the invention can be implemented for fabricating one or more see-saw accelerometers in a substrate. For purposes of identification, a first embodiment of such a process will be referred to herein as a two epitaxial layer dissolved silicon process. Referring now to FIGS. 7A–7C, a see-saw accelerometer is illustrated in plan and cross sectional views. The see-saw accelerometer comprises a mass 100 which is asymmetric with respect to first and second flexures 102. The flexures 102 extend inwardly toward the mass 100 from first and second anchor points 104, and suspend the mass 100 above a substrate 106 for rotation about an axis through the first and second flexures 102. A plurality of electrodes 108 are disposed beneath the mass to excite the mass 100 and/or capacitively sense displacement thereof.

Figure 8A:
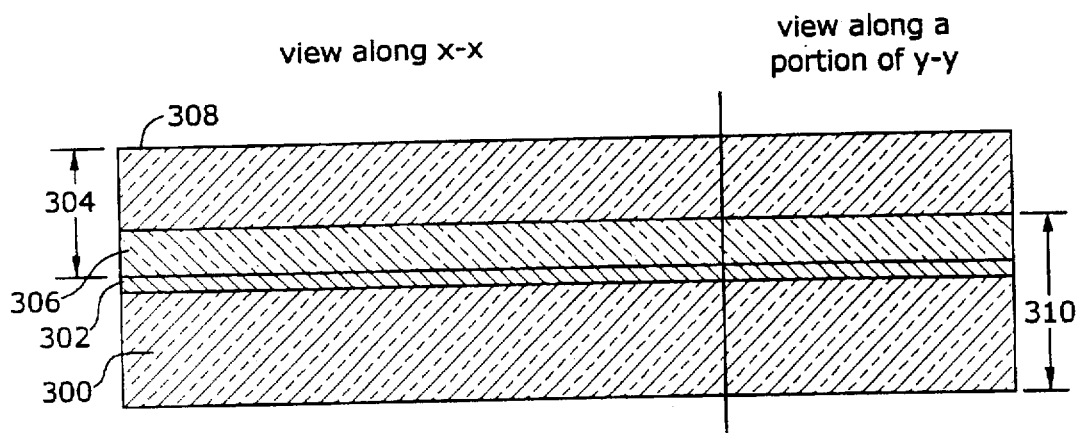
FIG. 8A is a partial view in section of a starting wafer in processing step for the see-saw accelerometer of FIG. 7A.
Figure 8B:
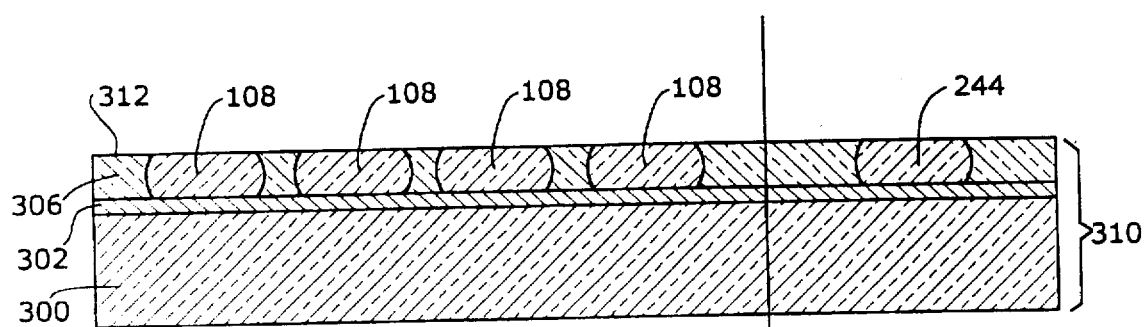
FIGS. 8B–8F are partial views in section of further processing steps for the see-saw accelerometer of FIG. 7A according to a two epitaxial layer dissolved silicon process.

Referring now to FIGS. 8A–8F the process of fabricating the see-saw accelerometer according to the invention begins with an N-type silicon substrate 300, referred to as a "handle," having a first oxidized surface 302. The handle 300 is typically, though not necessarily, on the order of 500 microns in thickness. A second silicon wafer 304 having a thin N layer 306 and a larger P layer 308 is wafer bonded to the oxidized surface 302 of the handle 300. The exposed P layer 308 is then removed by electrochemical etching or other suitable means, resulting in a starting wafer 310 as shown in FIG. 8B. Again, substrates of this type, referred to as SOI (silicon-on-insulator) wafers, can be implemented and made commercially available by silicon foundries. It is intended, but not necessary, that commercially available SOI wafers be used as input to the fabrication process to appreciate the advantages thereof.

This type of starting wafer 310 is generic to many different micromechanical devices, thus facilitating the fabrication of varied devices on one starting wafer 310. This can be used to advantage in several ways. First, it is possible to fabricate more than one instrument at a time by this process. Second, the starting wafer may be shipped to a foundry for incorporation of electronic devices prior to or after inertial instrument fabrication. Clearly, this is feasible although the instrument fabrication needs some modification to do this.

While the first surface 302 of the N-type silicon substrate 300 of FIG. 8A has been described as being of silicon oxide, it is also possible to use a silicon nitride layer, preferably silicon rich, to form a dielectric layer having a superior thermal expansion match within the layers of the starting wafer 310. This is particularly important when larger wafers are required since any thermal discontinuity would be exaggerated.

With reference to FIG. 8B, a fabrication process will be described which relies on high concentration boron doping as an anisotropic etch stop. EDP (ethylene-diamine-pyrocatechol-water) is one example of an etchant employed. A now exposed surface 312 of the thin N layer 306 is oxidized and photolithographically patterned to enable selective boron diffusion into the thin N layer 306. The diffusion goes completely through the N layer 306 and results in a high boron concentration at the oxide interface. Specifically, a boron diffusion will form an electrode 108, such as a drive electrode or a sense electrode. The boron diffusion will also form base portion(s) 244 of the anchor(s) 104.

Figure 8C:
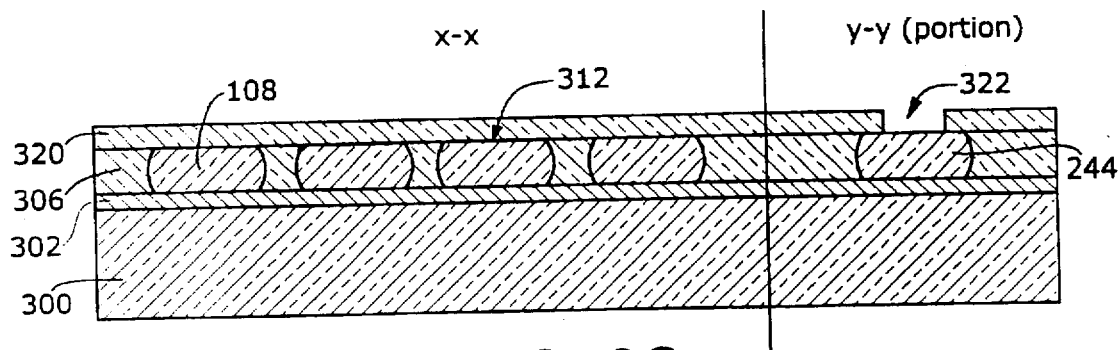

As illustrated in FIG. 8C, an N type lightly doped first epitaxial layer 320 is deposited on the exposed surface 312 of the thin N layer 306 to a desired thickness. In the completed accelerometer of FIGS. 7A–7C, the thickness of the N type epitaxial layer is equal to an electrode gap between the mass 100 and either the drive or sense electrodes 108. A nominal electrode gap thickness for this process is 3 microns. The N type epitaxial layer 320 is then etched to form at least one via 322, exposing a segment of the base portion 244 of the anchor(s) 104. Since electrode gaps for multiple devices located on the same wafer are created simultaneously by deposition of one epitaxial layer 320, enhanced uniformity of gap thickness is achieved.

Figure 8D:
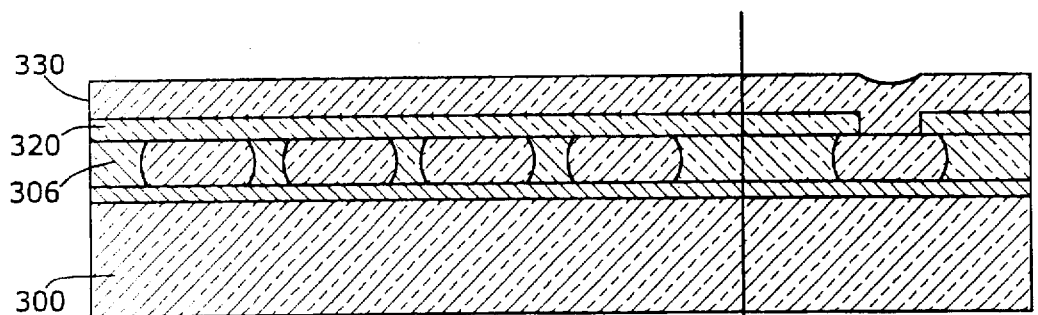
Figure 8E:
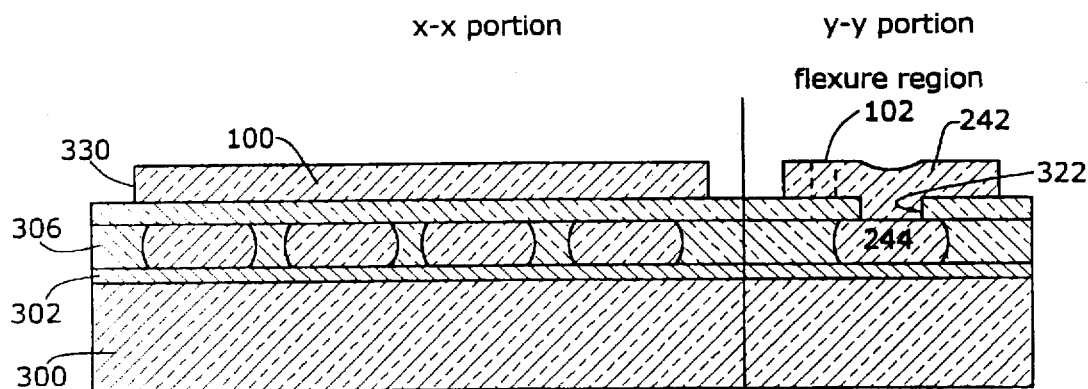

Once vias 322 are etched through the N type epitaxial layer 320, a heavily boron (P+) doped epitaxial layer 330 is deposited to a thickness desired for the proof mass 100, as illustrated in FIG. 8D. In order to minimize stress inherent in silicon having a high boron concentration, which can cause geometric and thermal distortion, it is preferable to include germanium at a concentration roughly equivalent to the boron concentration. Further, by epitaxially depositing boron and germanium doped layers rather than diffusing boron and germanium, the P+epitaxial layer 330 is free from concentration gradients which cause curling of the layer and of the device ultimately etched therefrom. The thickness of the P+epitaxial layer 330 is also subject to much greater control in comparison to a diffusion method, in which a P type material is heavily doped into an existing silicon layer.

The P+doped epitaxial layer 330 is used to form the majority of the suspended part of the see-saw accelerometer. The P+doped epitaxial layer 330 is masked in a manner known in the art, such as by photoresist and/or metal mask, and patterned using reactive ion etching (RIE). Thus, referring now to FIG. 8E, the proof mass 100, flexures 102, and anchor body 242 are formed in the P+doped epitaxial layer, and the anchor body 242 is bonded to the anchor base 244 through the via 322. To form low aspect ratio parts such as a ribbon flexible element, a separate RIE step is required to remove a portion of the P+epi layers in this flexure region to increase the design flexibility for determining flexure stiffness.

An advantage of this process is that formation of the proof mass 100 and flexible elements 102 with respect to the already formed electrodes 108 occurs under ideal alignment conditions, resulting in highly accurate alignment. This is in contrast to methods involving anodic bonding of a device formed of a silicon wafer and an insulating substrate such as glass.

It is at this stage that metallization for interconnects is deposited and patterned. TiW, Pd, and Au are suitable sequentially applied materials for these purposes. The areas where wire bonding is to take place are built up in a fashion similar to the via 322 and proof mass 100 so that metallization takes place on the top surface of the second epitaxial layer 330 prior to anisotropic etching.

Figure 8F:
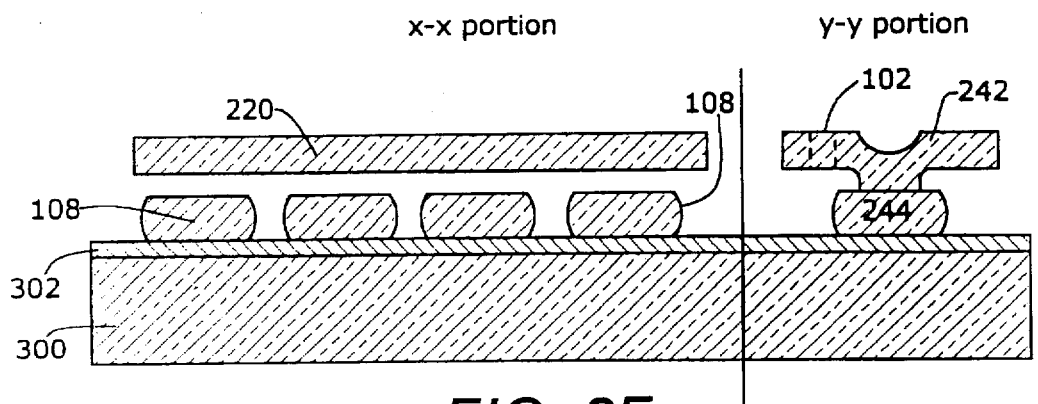

Placing the structure formed as described thus far in an ethylene-diamine-pyrocatechol-water (EDP) bath is the final step in the formation of the accelerometer. The N type material is etched away, leaving behind the heavily boron doped regions and the oxide or nitride first surface 302 on the handle 300, as illustrated in FIG. 8F.

One of the principle advantages of the two epitaxial layer dissolved silicon process described with respect to FIGS. 8A–8F lies in the control one has over the thickness of the N lightly doped first epitaxial layer, and thus over the electrode gap thickness in the finished device(s). This advantage is counterbalanced by the requirement of carrying out two epitaxial depositions.

An analogous process to that just described can be used to fabricate a see-saw accelerometer in polysilicon, according to the invention. A virtually identical starting wafer can be used to implement the polysilicon device, as used and described with respect to FIG. 8A. In such a polysilicon process, P+and N polysilicon are substituted for the single crystal epitaxially grown layers.

Similarly, a polysilicon device can be fabricated using a starting wafer of nitride coated silicon. Again, in such a polysilicon device, P+and N polysilicon are substituted for the single crystal epitaxially grown layers.

A second method for fabricating micromechanical devices such as gyroscopes and accelerometers, including the see-saw accelerometer embodiment disclosed herein, is a single epitaxial layer dissolved silicon process. Referring to FIGS. 9A–9F, fabrication of the monolithic, micromechanical see-saw accelerometer of FIGS. 7A–7C begins with the same SOI handle as described with reference to FIGS. 8A and 8B. Specifically, with reference to FIG. 9A, a starting wafer 610 consisting of a P+type silicon wafer "handle" 600 and an oxide or nitride surface layer 602 is wafer bonded to a thin N-type layer 606 of a wafer 604 consisting the N-type layer 606 and a P-type layer 608. An approximate thickness for the handle layer 600 is 500 microns. The P-type layer 608 is then removed by electrochemical etching.

The comments made hereinbefore with respect to fabrication of more than one device on one such starting wafer, are equally applicable to the presently disclosed process.

Figure 9A:
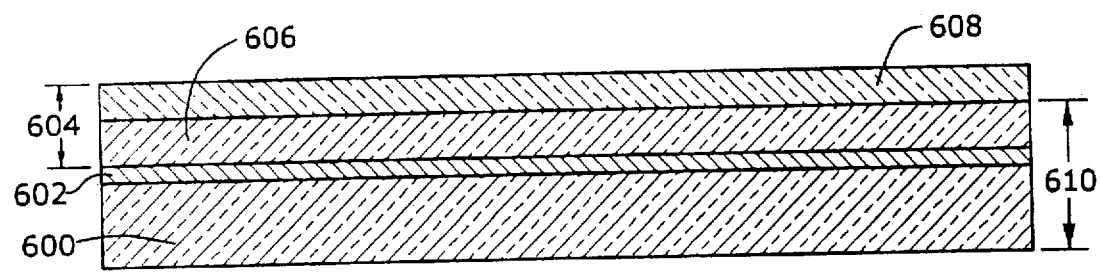
FIGS. 9A–9F are partial views in section of processing steps for the see-saw accelerometer of FIG. 7A according to a single epitaxial layer dissolved silicon process.
Figure 9B:
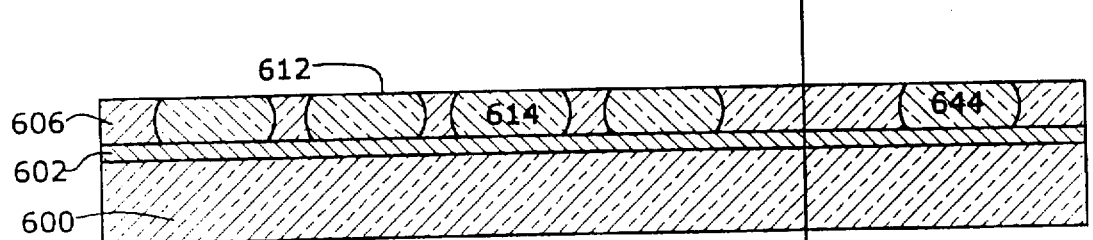

With reference to FIG. 9B, a fabrication process will be described which relies on high concentration boron doping as an anisotropic etch stop. EDP (ethylene-diamine-pyrocatechol-water) is one example of an etchant employed. A now exposed surface 612 of the thin N layer 606 is oxidized and photolithographically patterned to enable selective boron diffusion into the thin N layer 606. The diffusion goes completely through the N layer 606 and results in a high boron concentration at the oxide interface.

Specifically, a boron diffusion will form an electrode 614, such as a drive electrode or a sense electrode as known in the art. The boron diffusion will also form a base portion 644 of the anchor(s).

Figure 9C:
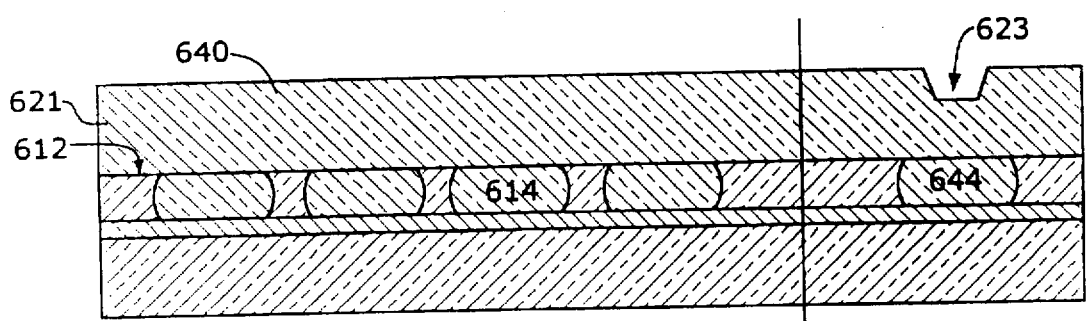

As illustrated in FIG. 9C, and in contrast to the two epitaxial layer deposition process of FIGS. 8A–8F, the present process calls for a single N-type epitaxial layer 621 deposition on the exposed surface 612 of the thin N layer 606. With reference to the completed accelerometers of FIGS. 7A–7C, the thickness of the N type epitaxial layer is equal to an electrode gap between a flexure 102 and either the drive or sense electrodes plus the thickness of the proof mass 100 suspended thereover. The nominal thickness for this epitaxial layer 621 is 10 microns. The nominal thickness for the resultant electrode gap 650 thickness is between three and six microns.

As shown in FIG. 9C, a pit 623 is etched into an exposed surface 640 of the N type epitaxial layer 621. The depth of the pit 623 is roughly equivalent to the desired electrode gap 650 thickness in the finished device. Each pit 623 is positioned in the surface of the N type epitaxial layer over a respective anchor base portion 644.

Figure 9D:
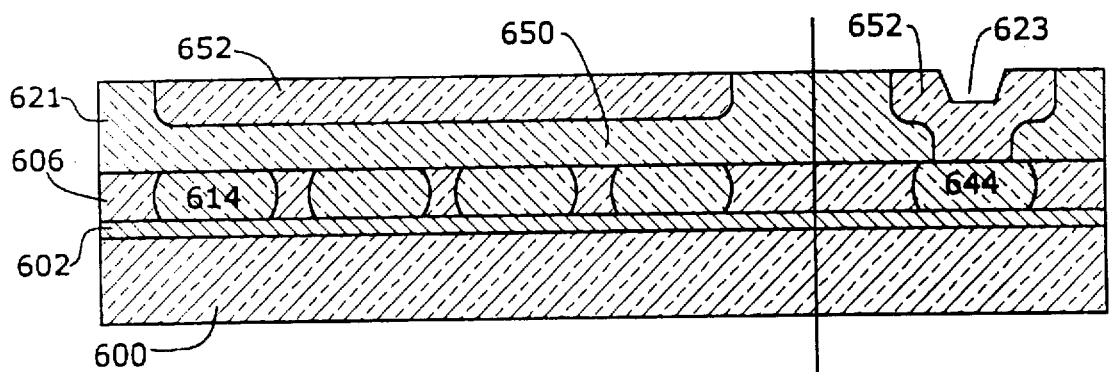

The next step, as illustrated in FIG. 9D, includes oxidizing and photolithographically patterning the exposed surface of the epitaxial layer 621 to enable selective boron (P+) diffusion into the epitaxial layer 621 to form a P+doped device region 652. Where a pit 623 has been etched, the diffusion goes through the epitaxial layer 621 and all the way to the underlying anchor base portion 644. The electrode gap 650 between the P+doped region 652 and previously doped electrodes 614 is thus defined by the distance between the leading edge of the doped region 652 and a proximate surface of the underlying electrode 614. As is known in the art, the metallurgical junction depth is deeper than the depth at which an etch stopping concentration is obtained. For simplicity junction depth is herein referred only to that junction depth at which an etch stopping concentration is maintained.

Figure 9E:
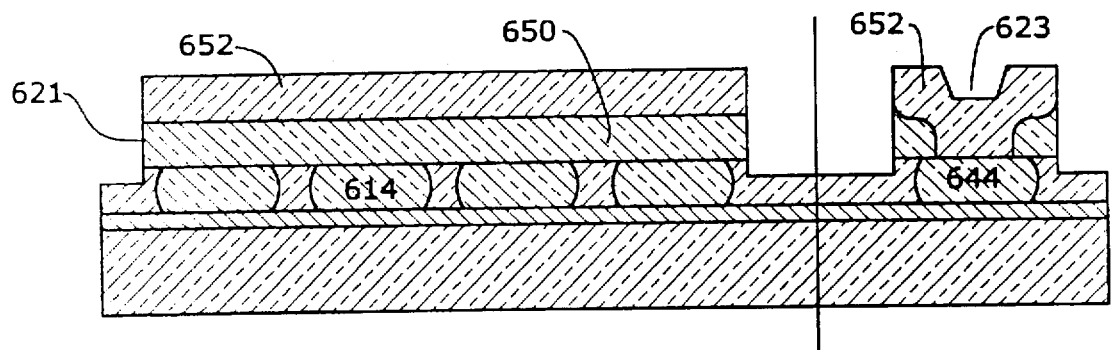

The epitaxial layer 621, including the boron doped P+region 652, is masked in a manner known in the art, such as by photoresist and/or metal mask, and patterned using reactive ion etching (RIE). Thus, as shown in FIG. 9E, the peripheral proof mass 620, flexible elements 622, and anchor body 642 are defined.

An advantage of this alternative process is that only one epitaxial layer 621 deposition is required. Further, formation of the proof mass 620 and flexible elements 622 with respect to the already formed electrodes 614 occurs under ideal conditions, resulting in highly accurate alignment. This is in contrast to prior art methods involving anodic bonding of a device formed of a silicon wafer and an insulating substrate such as glass.

It is at this stage that metallization for interconnects is deposited and patterned. TiW, Pd, and Au are suitable sequentially applied materials for these purposes. The areas where wire bonding is to take place are built up in a fashion similar to the proof mass so that metallization takes place on the top surface of the epitaxial layer 621 prior to anisotropic etch.

Figure 9F:
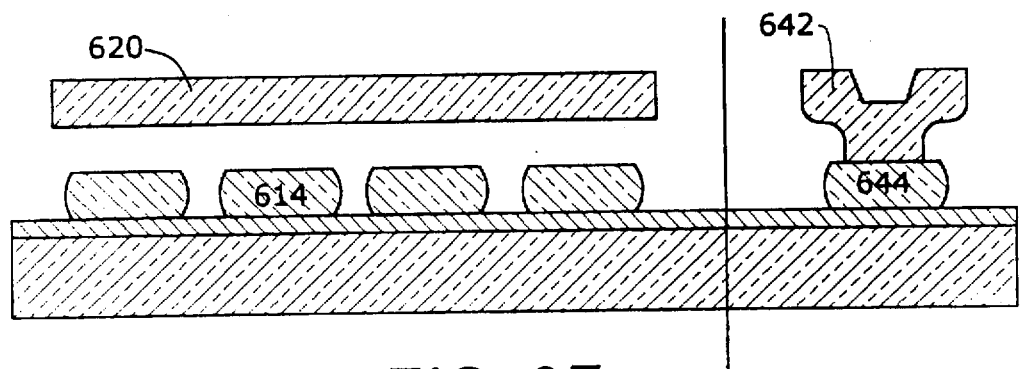

Placing the structure formed as described thus far in an ethylene-diamine-pyrocatechol-water (EDP) bath is the final step in the formation of the accelerometer. The undoped N-type material the epitaxial layer 621 is etched away along with the undoped portions of the thin N layer 606, leaving behind the heavily boron doped regions and the oxide or nitride first surface 602 on the handle 600, as illustrated in FIG. 9F.

A third method for fabricating micromechanical devices such as gyroscopes and accelerometers, including the see-saw accelerometer embodiment as disclosed herein, is a modification of the process according to the invention, which will be referred to herein as a single epitaxial layer electrochemically etched silicon process. Referring to FIGS. 10A–10E, fabrication of the monolithic, micromechanical see-saw accelerometer begins with a similar SOI handle as described hereinbefore. However, with reference to FIGS. 10A and 10B, a starting wafer 710 consisting of an N-type silicon wafer 700 and an oxide or nitride surface layer 702 is wafer bonded to a thin P-type layer 706 of a wafer 704 consisting of the P-type layer 706 and an N-type "handle" layer 708. The N-type layer 708 is then removed by mechanical lapping and polishing or other suitable means.

The comments made above with respect to fabrication of more than one device on one such starting wafer, are equally applicable to the presently disclosed process.

Figure 10A:
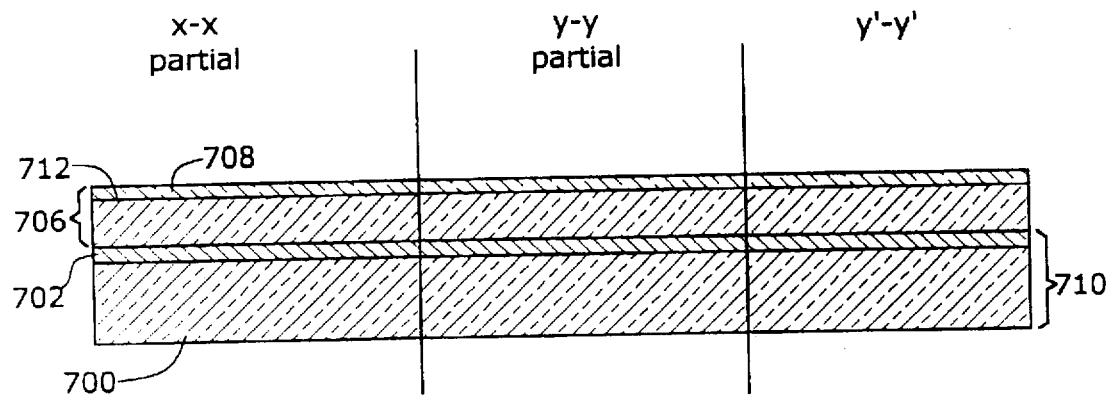
FIGS. 10A–10E are partial views in section of processing steps for the see-saw accelerometer of FIG. 7A according to a single epitaxial layer electrochemically etched fabrication process.
Figure 10B:
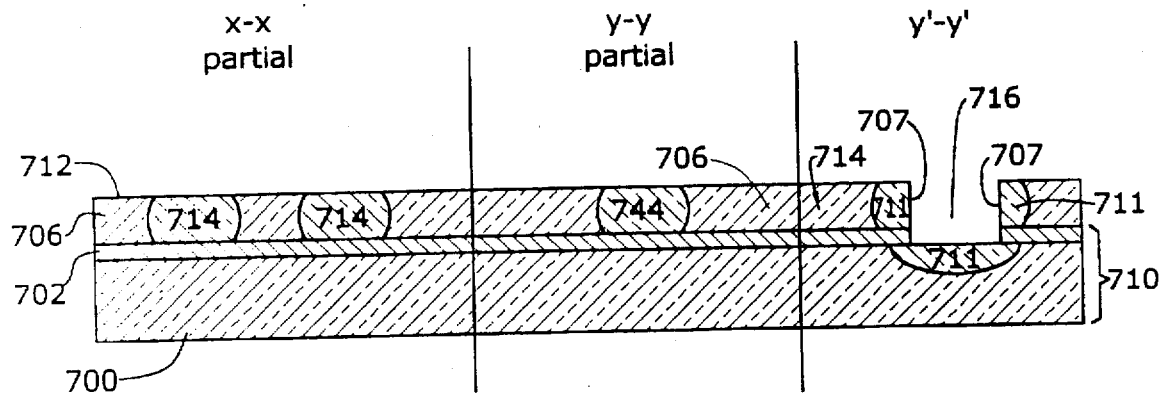

With reference to FIG. 10B, a fabrication process will be described which relies on arsenic and phosphorous doping as an electrochemical etch stop. KOH (potassium hydroxide) is one example of an etchant employed. A window is patterned on an exposed surface 712 of the thin P layer 706, and a via is etched through the thin N layer and the oxide or nitride layer 702, exposing the N substrate 700. This forms the basis for a via 716 which will eventually enable electrical interconnection of N-type device elements, described hereinafter, with the N-type substrate 700. The role of this interconnection in electrochemical etching will be discussed.

The exposed surface 712 of the thin P layer 706 is oxidized and photolithographically patterned to enable selective arsenic diffusion into the thin P layer 706 and into the via 716. The diffusion goes completely through the P layer 706, leaving a thin layer of arsenic on walls 707 of the via 716, and results in an arsenic concentration at the oxide interface. The diffusion also goes through the via 716 and into the N-type substrate 700 to form a via interface 711. Specifically, the arsenic diffusion will be used to form electrode(s) 714, such as a drive electrode or a sense electrode. The arsenic diffusion will also form a base portion 744 of anchor(s) (104 of FIG. 7C). Arsenic is a preferred dopant in the present method since it is a slow diffuser, and will not spread significantly during subsequent thermal processing of the substrate. This reduces the potential for the closing of small gaps due to inadvertent diffusion.

Figure 10C:
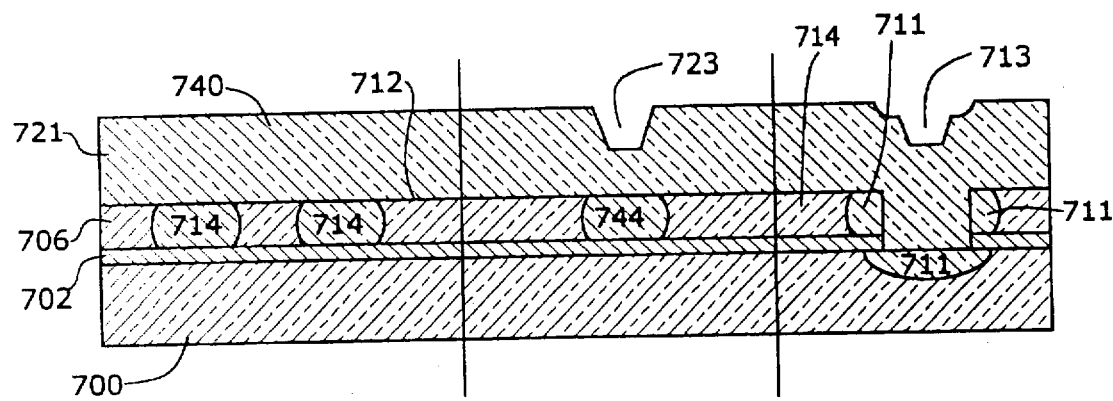

As illustrated in FIG. 10C, the present process calls for a single P-type epitaxial layer 721 deposition on the exposed surface 712 of the thin P layer 706. With reference to the completed accelerometers illustrated in FIGS. 7A–7C, the thickness of the P type epitaxial layer is equal to an electrode gap between a flexible element 102 and either the drive or sense electrodes 108 plus the thickness of the proof mass 100 suspended thereover.

A pit 723 is etched into an exposed surface 740 of the P type epitaxial layer 721. The depth of the pit 723 is roughly equivalent to the desired electrode gap (750 in FIG. 10D discussed hereinafter) thickness in the finished device. Each pit 723 is positioned in the surface of the P type epitaxial layer over a respective anchor base portion 744.

A via doping etch pit 713 is also formed into the exposed surface 740 of the P-type epitaxial layer 721. This doping etch pit 713 will enable the diffusion of a second dopant into contact with the via interface 711 formed of arsenic.

Figure 10D:
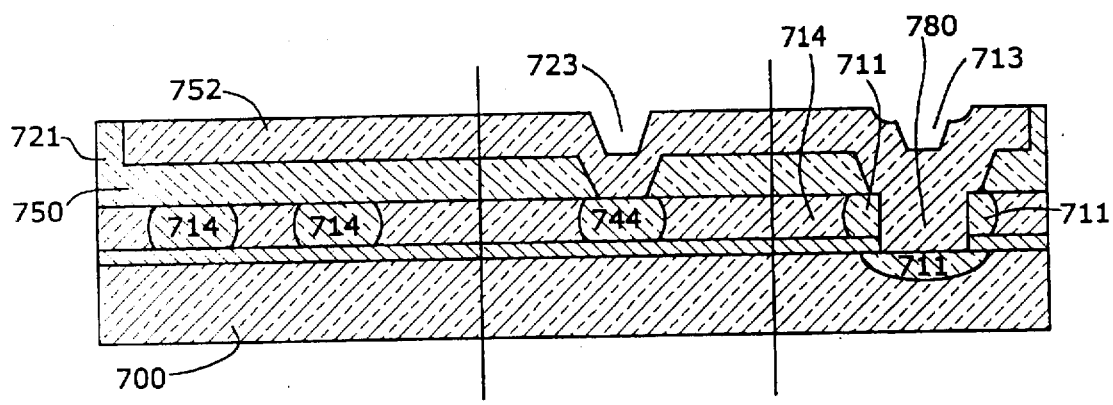

The next step, as illustrated in FIG. 10D, includes oxidizing and photolithographically patterning the exposed surface 740 of the epitaxial layer 721 to enable selective phosphorous doping into the epitaxial layer 721 to form an N doped device region 752. Where a pit 723 has been etched, the diffusion goes through the epitaxial layer 721 and all the way to the underlying anchor base portion 744. The electrode gap 750 between the N doped region 752 and previously doped electrodes 714 is thus defined by the distance between the leading edge of the doped region 752 and a proximate surface of the underlying electrode 714.

The via etch pit 713 formed in the P epitaxial layer enables the diffusion of the phosphorous down to the arsenic via interface 711 in the N substrate 700. Together, the arsenic doped via interface 711 and the overlying phosphorous doped via etch pit 713 form the via 716 itself.

Figure 10E:
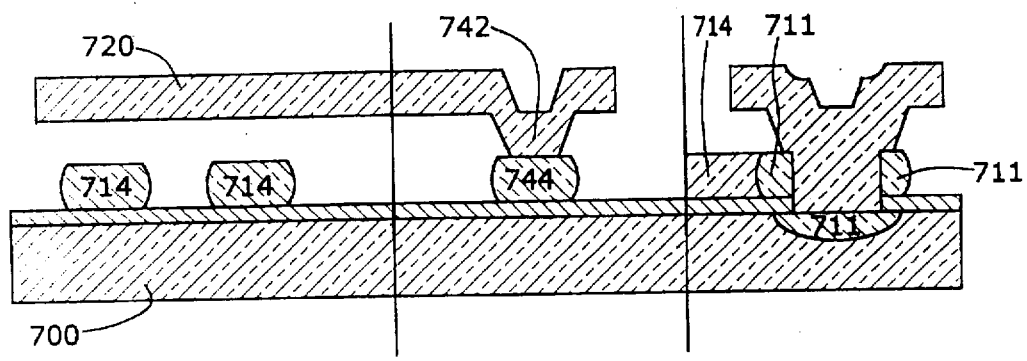

The epitaxial layer 721, including the phosphorous doped N region 752, is masked in a manner known in the art, such as by photoresist and/or metal mask and may additionally be patterned using RIE. Thus, as shown in FIG. 10E, the peripheral proof mass 720, flexible elements or flexures, the anchor body 742 and via 716 are defined.

An advantage of this process is that only one epitaxial layer 721 deposition is required. Further, formation of the proof mass 720 and flexures with respect to the already formed electrodes 714 occurs under ideal alignment conditions, resulting in highly accurate alignment. This is in contrast to methods involving anodic bonding of a device formed of a silicon wafer and an insulating substrate such as glass.

It is at this stage that metallization for interconnects is deposited and patterned. TiW, Pd, and Au are suitable sequentially applied materials for this purpose. The areas where wire bonding is to take place are built up in a fashion similar to the proof mass so that metallization takes place on the top surface of the epitaxial layer 721 prior to electrochemical etch.

The structure formed thus far is next subjected to electrochemical etching. This process is carried out by connecting the N type material to an anode of a power source (not shown), and exposing the structure to a KOH solution carrying a negative charge. This will etch away P doped silicon, while leaving N doped silicon in place. Thus, by forming a via 716 between N doped regions 752 and the N substrate 700, the latter can be connected to the anode during KOH exposure, thus leaving behind the transducer device formed of N doped silicon.

Note that the representations of the devices in FIGS. 10A through 10E are not to scale, particularly with respect to the width of the proof mass 720, the length of the flexures, and the width of the anchor body 742. Further, note that additional steps are required to form flexures which are a different thickness than the proof mass 720 if such is desired. These may include separate diffusion or RIE steps.

Once the electrochemical process has been completed, a laser or other suitable means can be employed to sever an interconnection (not shown) between the via 716 and the remainder of the N doped structure 752 to disconnect the substrate layer 700 and the transducer device.

A fourth alternative embodiment of a method for fabricating micromechanical devices such as gyroscopes and accelerometers, including the see-saw accelerometer embodiment disclosed herein, is a double epitaxial layer electrochemically etched silicon process. Referring to FIGS. 11A–11E, fabrication of the monolithic, micromechanical see-saw accelerometer begins with a similar SOI handle as described with reference to FIGS. 10A and 10B. However, with reference to FIG. 11A, a starting wafer 810 consisting of an N-type silicon wafer 800 and an oxide or nitride surface layer 802 is wafer bonded to a thin P-type layer 806 of a wafer 804 consisting of the P-type layer 806 and an N-type "handle" layer 808. The N-type layer 808 is then removed by lapping or polishing.

Again, the comments made above with respect to fabrication of more than one device on one such starting wafer are equally applicable to the presently disclosed process.

Figure 11A:
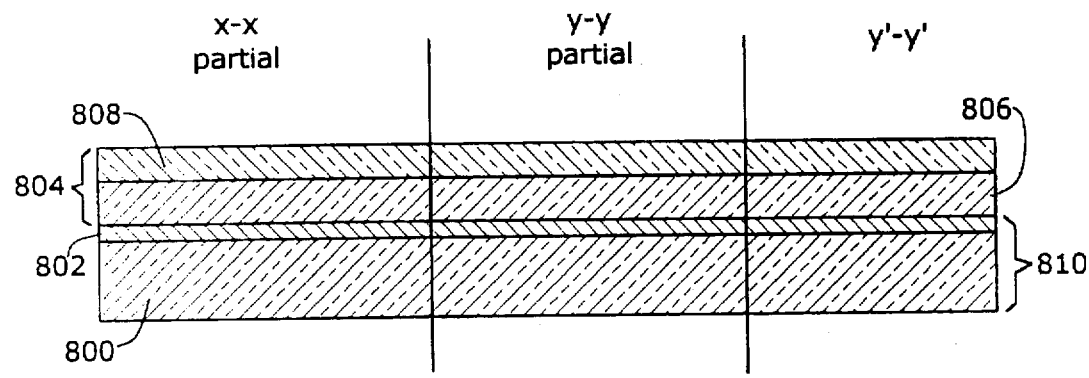
FIGS. 11A–11E are partial views in section of processing steps for the see-saw accelerometer of FIG. 7A according to a double epitaxial layer electrochemically etched fabrication process.
Figure 11B:
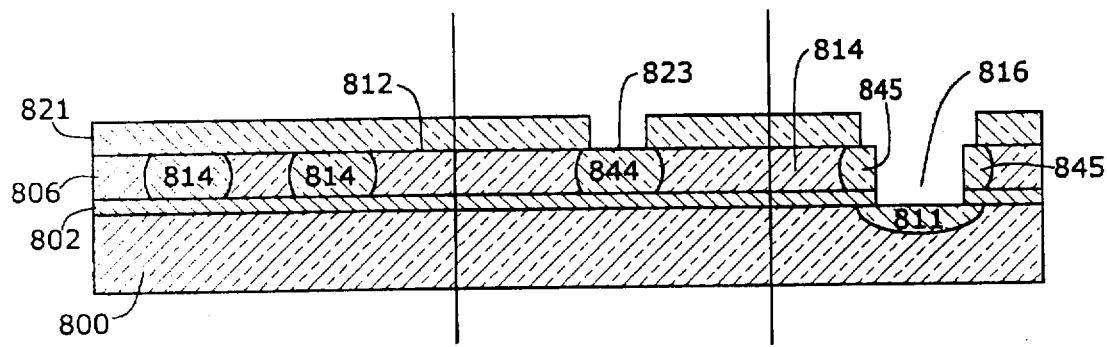

With reference to FIG. 11B, a fabrication process will be described which relies on arsenic and phosphorous doping as an electrochemical etch stop. KOH (potassium hydroxide) is one example of an etchant employed. A window is patterned on an exposed surface 812 of the thin P layer 806, and a via 816 is etched through the thin P layer 806 and the oxide or nitride layer 802, exposing the N substrate 800. This forms the basis for the via 816 which will eventually enable electrical interconnection of N-type device elements, described hereinafter, with the N-type substrate 800. Generally, one such via 816 is provided for each device on the wafer, though more or less can be employed. The role of this interconnection in electrochemical etching will be discussed.

The exposed surface 812 of the thin P layer 806 is oxidized and photolithographically patterned to enable selective arsenic diffusion into the thin P layer 806 and into the via 816. The diffusion goes completely through the P layer 806, leaving a thin N layer on the walls 807 of the via 816, and results in an arsenic concentration at the oxide interface 802. The diffusion also goes through the via 816 and into the N-type substrate 800 to form a via interface 811.

The immediate vicinity of the via 816 is also doped N type. In addition, interconnections (845), discussed later, are diffused to interconnect all N regions to the substrate via 811. An arsenic diffusion will form electrodes 814, such as drive electrodes or sense electrodes. The arsenic diffusion will also form a base portion 844 of central anchor(s) (104 as shown in FIG. 7C). Interconnections 845 are also formed at the same time and in the same manner as the electrodes 814 and serve to electrically connect all N regions to be protected to the substrate at the via 816. Arsenic is a preferred dopant in the present method since it is a slow diffuser, and will not spread significantly during subsequent thermal processing of the substrate. This reduces the potential for the closing of small gaps due to inadvertent dopant diffusion.

Figure 11C:
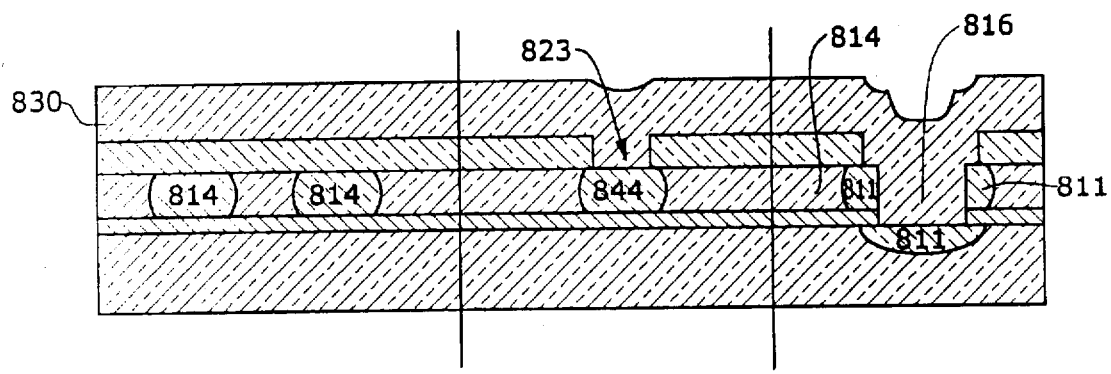

As illustrated in FIGS. 11B and 11C, the present process calls for a first P-type epitaxial layer 821 deposition on the exposed surface 812 of the thin P layer 806. With reference to the completed accelerometers, the thickness of the P type epitaxial layer is equal to an electrode gap between a flexure (102 of FIG. 7A) and either the drive or sense electrodes (108 of FIG. 7B).

The P-type first epitaxial layer 821 is then etched to form at least one anchor interconnect 823, exposing a segment of the base portion 844 of the anchors (104 of FIG. 7C). (not shown). Each anchor interconnect 823 is positioned in the surface of the P type epitaxial layer over a respective anchor base portion 844. Since electrode gaps for multiple devices located on the same wafer are created simultaneously by deposition of one epitaxial layer 821, enhanced uniformity of gap thickness is achieved. The P-type first epitaxial layer 821 is also etched in the area of the via 816 to expose the arsenic doped via interface 811.

Once anchor interconnects 823 and vias 816 are etched through the P-type first epitaxial layer 821, as illustrated in FIG. 11C a phosphorous doped second epitaxial layer 830 is deposited to a thickness desired for the proof mass (100 in FIGS. 7A–7C). The N-type second epitaxial layer 830 is deposited into the anchor interconnects 823, making contact with the anchor base portion 844. The second epitaxial layer 830 is also deposited into the via 816, establishing electrical communication between the N-type second epitaxial layer 830 and the N-type substrate 800 through the via interface 811. Layer 830 also establishes an electrical connection between via interface 811 and interconnections 845.

Figure 11D:
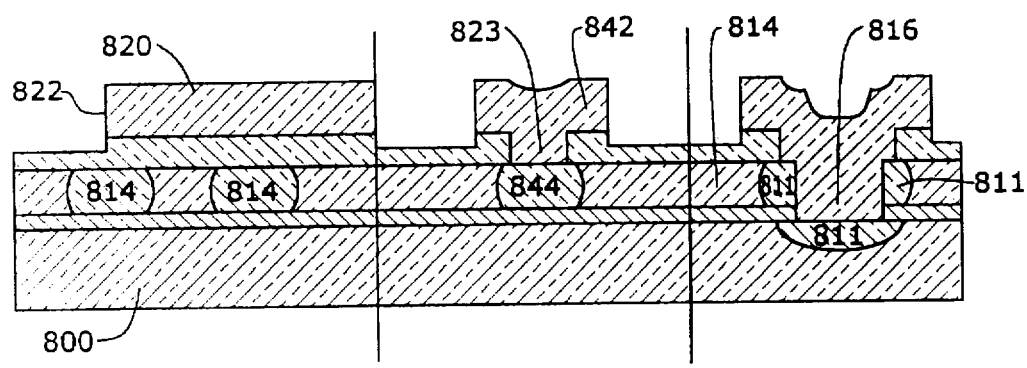

The N-doped second epitaxial layer 830 is used to form the majority of the suspended part of the accelerometer of FIGS. 7A–7C. This layer 830 is masked in a manner known in the art, such as by photoresist and/or metal mask, and patterned using reactive ion etching (RIE). Thus, as shown in FIG. 11D, the proof mass 820, flexible elements 822, and anchor body 842 are formed, and the anchor body 842 is bonded to the anchor base 844 through the anchor interconnect 823. Note that additional steps would be required to form flexible elements 822, if they are to be a different thickness than the proof mass 820. These may include separate diffusion or RIE steps.

An advantage of this alternative embodiment of the process, as with the other alternatives discussed hereinbefore, is that formation of the proof mass 820 and flexible elements 822 with respect to the already formed electrodes 814 occurs under ideal alignment conditions, resulting in highly accurate alignment. This is in contrast to methods involving anodic bonding of a device formed of a silicon wafer and an insulating substrate such as glass.

The metallization for interconnects is now deposited and patterned. TiW, Pd, and Au are suitable sequentially applied materials for these purposes. The areas where wire bonding is to take place are built up in a fashion similar to the proof mass so that metallization takes place on the top surface of the second epitaxial layer 830 prior to electrochemical etch.

Figure 11E:
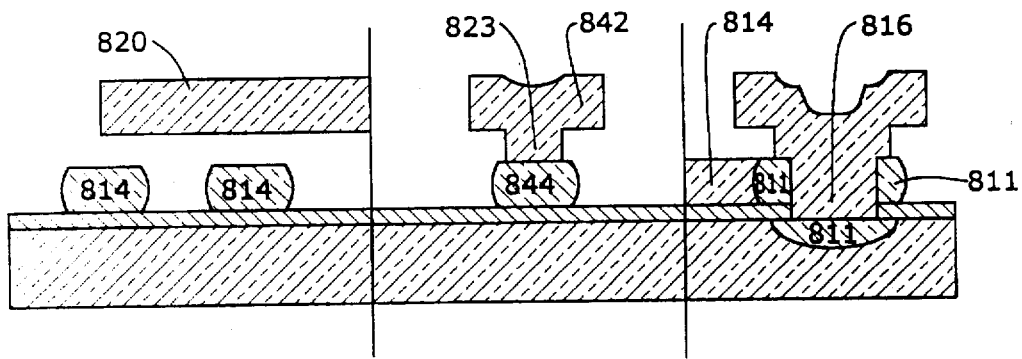

The structure formed thus far is next subjected to electrochemical etching. This process is carried out by connecting the N-type material to an anode of a power source (not shown), and exposing the silicon structure to a KOH solution carrying a negative charge. This will etch away P-type silicon, while leaving N-type silicon in place. By forming a via 816 between N-type device regions and the N substrate 800, the latter can be connected to an anode during KOH exposure, thus leaving behind the transducer device formed of N doped silicon, as illustrated in FIG. 11E. Note that the representations of the devices in FIGS. 11A through 11E are not to scale, particularly with respect to the width of the proof mass 820, the length of the flexible elements 822, and the width of the anchor body 842.

Once the electrochemical process has been completed, a laser or other suitable means may be employed to sever interconnections between the via 816 and the remainder of the N-type structure to eliminate coupling of the substrate 800 to the transducer device.

It should be noted that the methods described hereinbefore can all be used to fabricate a plurality of devices, similar or dissimilar, e.g. a plurality of accelerometers or gyroscopes, or a combination of devices, on a single chip. Such would be useful and advantageous for fabricating multi-axis inertial measurement units.

One of the benefits of employing the electrochemical processes as described hereinbefore is that by avoiding the high dopant concentrations required for the dissolved silicon processes disclosed, the resulting transducer structure is less prone to developing internal strain such as is associated with high concentration boron diffusions.

An advantage of using the substrate as a common electrical connection for electrochemical etching is that a heavily doped N type substrate may be used to minimize ohmic drops across the wafer. Some current always flows during the electrochemical etch. Thus, ohmic drops will vary the bias on the regions to be protected causing some of them to etch improperly.

Specific features of the invention are shown in some drawings and not in others, this is for convenience only as each feature may be combined with any or all of the other features in accordance with the invention.

Although the invention has been shown and described with respect to exemplary embodiments thereof, various changes, omissions and additions in the form and detail thereof may be made therein without departing from the spirit and scope of the invention.

What is claimed is:

1. A process for fabricating a micromachined structure, said process comprising the steps of:
   selecting a starting wafer having a first single crystal silicon substrate with at least one dielectric surface and a second single crystal silicon substrate bonded to said at least one dielectric surface of said first silicon substrate;
   masking, patterning and diffusing said second single crystal silicon substrate with a first impurity in selected regions forming at least one of an electrode region and an anchor region;
   depositing a first sacrificial layer of single crystal silicon over said at least one of said electrode region and said anchor region, forming a gap spacer;
   depositing a first device layer of single crystal silicon over said gap spacer, said first device layer being doped in selected areas with an impurity to impart etch resistance to form a first device layer that has etch resistant areas;
   masking and patterning said first device layer forming a suitable geometry for said micromachined structure; and etching away said first sacrificial layer of single crystal silicon leaving said micromachined structure while preserving said dielectric surface.

2. The process of claim 1 further including the step of adding metallizations for bonding pads and interconnects for electrical interconnection with said electrode region.

3. The process of claim 1 wherein said at least one dielectric surface is a silicon nitride surface.

4. The process of claim 1 wherein said at least one dielectric surface is an oxide surface.

5. The process of claim 1 wherein said first impurity is boron.

6. The process of claim 1 further including a step of removing selected portions of said first sacrificial layer to form vias therein as anchor locations.

7. The process of claim 1 wherein said first device layer is a P+boron doped epitaxial layer.

8. The process of claim 1 wherein said etch resistant impurity includes at least one of Germanium and Boron.

9. The process of claim 1 wherein said micromachined structure patterned in said first device layer includes a membrane for use as a pressure sensor.

10. The process of claim 1 further including the steps of depositing a second sacrificial layer of single crystal silicon over said first device layer and depositing a second device layer of single crystal silicon over said second sacrificial layer, and wherein said first device layer comprises a bottom of a hollow beam and said second device layer comprises a top and sides of said beam.

11. The process of claim 1 wherein said micromachined structure patterned in said first device layer includes a see-saw accelerometer and a plurality of linkages.

12. The process of claim 1 further including the step of etching away selected portions of said second silicon substrate and said first device layer.

13. The process of claim 1 wherein said etch resistant impurity is at least one of arsenic and phosphorous and said first sacrificial layer is etched away by electrochemical etching.

14. The process of claim 12 wherein selected portions of said second silicon substrate and said first device layer are etched away by electrochemical etching.

15. The process of claim 1 wherein said micromachined structure patterned in said first device layer includes at least portions of a gyroscope and a plurality of linkages.

16. The process of claim 1 further including the steps of doping said first silicon substrate to form electrodes and aligning said first silicon substrate with said second silicon substrate.

17. The process of claim 16 wherein said first silicon substrate is doped to form a silicon z bar and said micromachined structure fabricated according to said process is a double gimbal gyroscope.

18. The process of claim 1 wherein said electrode regions are anchored to said dielectric surface by said diffusing step.

19. The process of claim 1 wherein said step of etching is performed using EDP etching.

* * * * *